(12) United States Patent
Kinoshita

(10) Patent No.: US 7,859,886 B2
(45) Date of Patent: Dec. 28, 2010

(54) RESISTANCE MEMORY ELEMENT AND METHOD OF MANUFACTURING THE SAME, AND SEMICONDUCTOR MEMORY DEVICE

(75) Inventor: Kentaro Kinoshita, Tottori (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/104,845

(22) Filed: Apr. 17, 2008

(65) Prior Publication Data

US 2008/0232154 A1 Sep. 25, 2008

Related U.S. Application Data

(63) Continuation of application No. PCT/JP2005/019234, filed on Oct. 19, 2005.

(51) Int. Cl.
*G11C 11/00* (2006.01)
(52) U.S. Cl. .............. 365/148; 365/46; 365/100; 365/158; 365/163
(58) Field of Classification Search .......... 365/51, 365/100, 148, 151, 154, 158, 163, 171, 184, 365/185.05, 185.22, 185.28, 189.06, 202, 365/209, 222, 225.7, 232; 438/3, 201, 210, 438/238, 240, 258, 582, 586, 597; 257/2, 257/4, 5, 22, 40, 48, 208, 209, 213, 288, 257/295, 296, 313, 315, 316, 324, 347, 351, 257/368, 406, 411, 421, 476, 516, 528, 532, 257/774; 374/178; 427/96.7; 430/290
See application file for complete search history.

(56) References Cited

U.S. PATENT DOCUMENTS

| | | | | |
|---|---|---|---|---|
| 5,293,335 | A * | 3/1994 | Pernisz et al. | 365/148 |
| 6,473,332 | B1 | 10/2002 | Ignatiev et al. | |
| 2003/0003674 | A1 * | 1/2003 | Hsu et al. | 438/385 |
| 2003/0042558 | A1 * | 3/2003 | Noguchi et al. | 257/406 |
| 2004/0159828 | A1 * | 8/2004 | Rinerson et al. | 257/2 |
| 2004/0159868 | A1 * | 8/2004 | Rinerson et al. | 257/295 |

(Continued)

FOREIGN PATENT DOCUMENTS

JP 2004-128471 A 4/2004

(Continued)

OTHER PUBLICATIONS

A. Beck et al; "Reproducible switching effect in thin oxide films for memory applications," Applied Physics Letters; Jul. 3, 2000; vol. 77; No. 1; pp. 139-141; Cited spec.

(Continued)

*Primary Examiner*—Richard Elms
*Assistant Examiner*—Harry W Byrne
(74) *Attorney, Agent, or Firm*—Westerman, Hattori, Daniels & Adrian, LLP

(57) ABSTRACT

A resistance memory element memorizing a high resistance state or a low resistance state in a memory region and switched between the high resistance state and the low resistance state by an application of a voltage includes a resistance memory layer 42 of a resistance memory material, an electrode 38 and an electrode 40 arranged, sandwiching the resistance memory layer 42. The electrode 38 and the electrode 40 are formed on the same surface, whereby the manufacturing process of the resistance memory element can be simplified.

17 Claims, 22 Drawing Sheets

U.S. PATENT DOCUMENTS

2005/0122757 A1* 6/2005 Moore et al. .................. 365/63
2005/0135147 A1* 6/2005 Rinerson et al. ............ 365/158
2005/0161747 A1 7/2005 Lung et al.
2007/0187829 A1* 8/2007 Lam et al. ................... 257/758

FOREIGN PATENT DOCUMENTS

| JP | 2005-93619 A | 4/2005 |
| JP | 2005-217408 A | 8/2005 |
| WO | 2004/015778 A1 | 2/2004 |

OTHER PUBLICATIONS

W.W. Zhuang et al; "Novell Colossal Magnetoresistive Thin Film Nonvolatile Resistance Random Access Memory (RRAM)," Tech. Digest IEDM 2002, pp. 193-196; Cited spec.

I.G. Baek et al; "Highly Scalable Non-volatile Resistive Memory using Simple Binary Oxide Driven by Asymmetric Unipolar Voltage Pulses," Tech. Digest IEDM 2004, p. 587; Cited spec.

International Search Report of PCT/JP2005/019234, date of mailing Jan. 24, 2006.

* cited by examiner

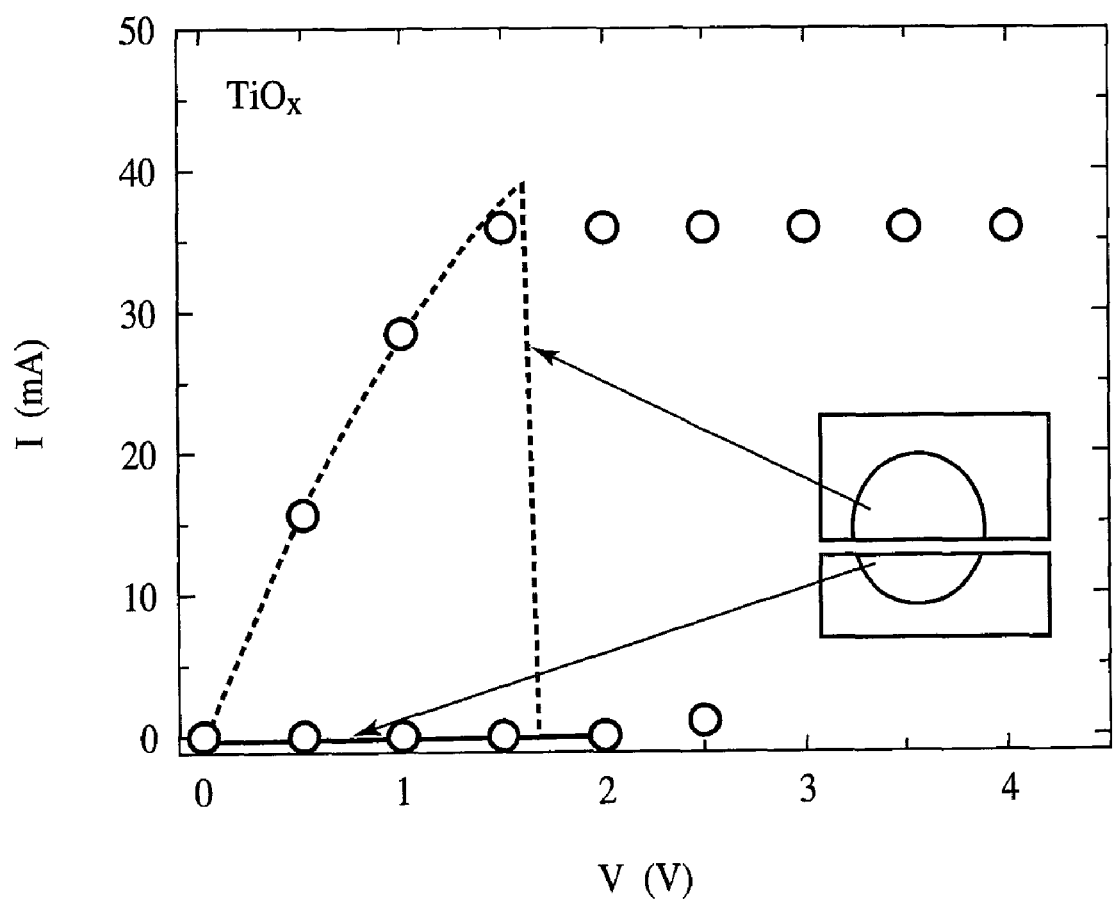

ies of the resistance memory element using a bipolar resistance memory material;
RESISTANCE MEMORY ELEMENT AND METHOD OF MANUFACTURING THE SAME, AND SEMICONDUCTOR MEMORY DEVICE

CROSS REFERENCE TO RELATED APPLICATIONS

This application is a Continuation of International Application No. PCT/JP2005/019234, with an international filing date of Oct. 19, 2005, which designating the United States of America, the entire contents of which are incorporated herein by reference.

TECHNICAL FIELD

The present invention relates to a resistance memory element and a method of manufacturing the same and a semiconductor memory device using the resistance memory element.

BACKGROUND

Recently, as a new memory device, a semiconductor memory device called Resistance Random Access Memory (RRAM) is noted. The RRAM uses a resistance memory element which has a plurality of resistance states of different resistance values, which are changed by electric stimulations applied from the outside and whose high resistance state and low resistance state are corresponded to, e.g., information "0" and "1" to be used as a memory element. The RRAM highly potentially has high speed, large capacities, low electric power consumption, etc. and is considered prospective.

The resistance memory element has a resistance memory material whose resistance states are changed by the application of voltages sandwiched between a pair of electrodes. As the typical resistance memory material, oxide materials containing transition metals are known.

The semiconductor memory device using the resistance memory element is disclosed in, e.g., U.S. Pat. No. 6,473,332, A. Beck et al., Appl. Phys. Lett., Vol. 77, p. 139 (2000), W. W. Zhuang et al., Tech. Digest IEDM 2002, p. 193, and I. G. Baek et al., Tech. Digest IEDM 2004, p. 587.

Dynamic Random Access Memory (DRAM) and Static Random Access Memory (SRAM), and Ferroelectric Random Access Memory (ReRAM), which is prospective as a nonvolatile RAM of the next generation, etc. must have areas of above a certain size so as to ensure a difference required for a reading between before and after a rewriting of data, which is one factor blocking their higher integration. Magnetoresistive Random Access Memory (MRAM) has larger current values necessary for the magnetization inversion as the element area is decreased, which limits the cell size in relation with the writing current value, etc. In view of them, nonvolatile memory materials which facilitate the integration increase and a nonvolatile memory device using such nonvolatile memory materials have been required.

SUMMARY

According to one aspect of an embodiment, there is provided a resistance memory element memorizing a high resistance state or a low resistance state in a memory region and switched between the high resistance state and the low resistance state by an application of a voltage, comprising: a first electrode formed over a substrate in a first region of the substrate; a second electrode formed over the substrate in a second region of the substrate different from the first region; and a resistance memory layer formed between the first electrode and the second electrode.

According to another aspect of an embodiment, there is provided a semiconductor memory device comprising: a resistance memory element memorizing a high resistance state or a low resistance state in a memory region and switched between the high resistance state and the low resistance state by an application of a voltage, the resistance memory element including: a first electrode formed over a substrate in a first region of the substrate; a second electrode formed over the substrate in a second region of the substrate different from the first region; and a resistance memory layer formed between the first electrode and the second electrode.

According to further another aspect of an embodiment, there is provided a method of manufacturing a resistance memory element memorizing a high resistance state or a low resistance state in a memory region and switched between the high resistance state and the low resistance state by applying a voltage between a pair of electrodes, comprising: forming a conductive film over a substrate; patterning the conductive film to form a first electrode in a first region and a second electrode in a second region different from the first region; and forming a resistance memory layer over the substrate with the first electrode and the second electrode formed on.

According to further another aspect of an embodiment, there is provided a method of manufacturing a resistance memory element memorizing a high resistance state or a low resistance state in a memory region and switched between the high resistance state and the low resistance state by applying a voltage between a pair of electrodes, comprising: forming a first electrode over a substrate in a first region; forming a resistance memory layer over the substrate; and forming a second electrode on the resistance memory layer in a second region different from the first region with the resistance memory layer interposed between the first electrode and the second electrode.

BRIEF DESCRIPTION OF THE DRAWINGS

FIG. 7 is a graph showing the current-voltage characteristics of each piece of the divided resistance memory element;

DETAILED DESCRIPTION OF THE EMBODIMENTS

The basic operation of the resistance memory element used in the nonvolatile semiconductor memory device according to the present invention will be explained with reference to FIGS. 1 to 9C.

The resistance memory element includes the resistance memory material sandwiched between a pair of electrodes. Many of the resistance memory material are oxide materials containing transition metals, and the resistance memory material is divided largely in two, depending on differences in the electric characteristics.

One of them uses voltages of different polarities so as to change the resistance states between the high resistance state and the low resistance state and includes $SrTiO_3$ and $SrZrO_3$ doped with a trace of an impurity, such as chrome (Cr) or others, and $Pr_{1-x}Ca_xMnO_3$ and $La_{1-x}Ca_xMnO_3$, etc., which exhibit CMR (Colossal Magneto-Resistance). Such resistance memory material which requires voltages of different polarities so as to rewrite the resistance state will be hereinafter called the bipolar resistance memory material.

The other of them is materials which require voltages of the same polarity so as to change the resistance states between the high resistance state and the low resistance state and includes oxides, etc., containing a single transition metal, such as $NiO_x$ and $TiO_x$. Such resistance memory materials which require voltages of the same polarity for rewriting the resistance states will be hereinafter called the unipolar resistance memory material.

Figure 1:
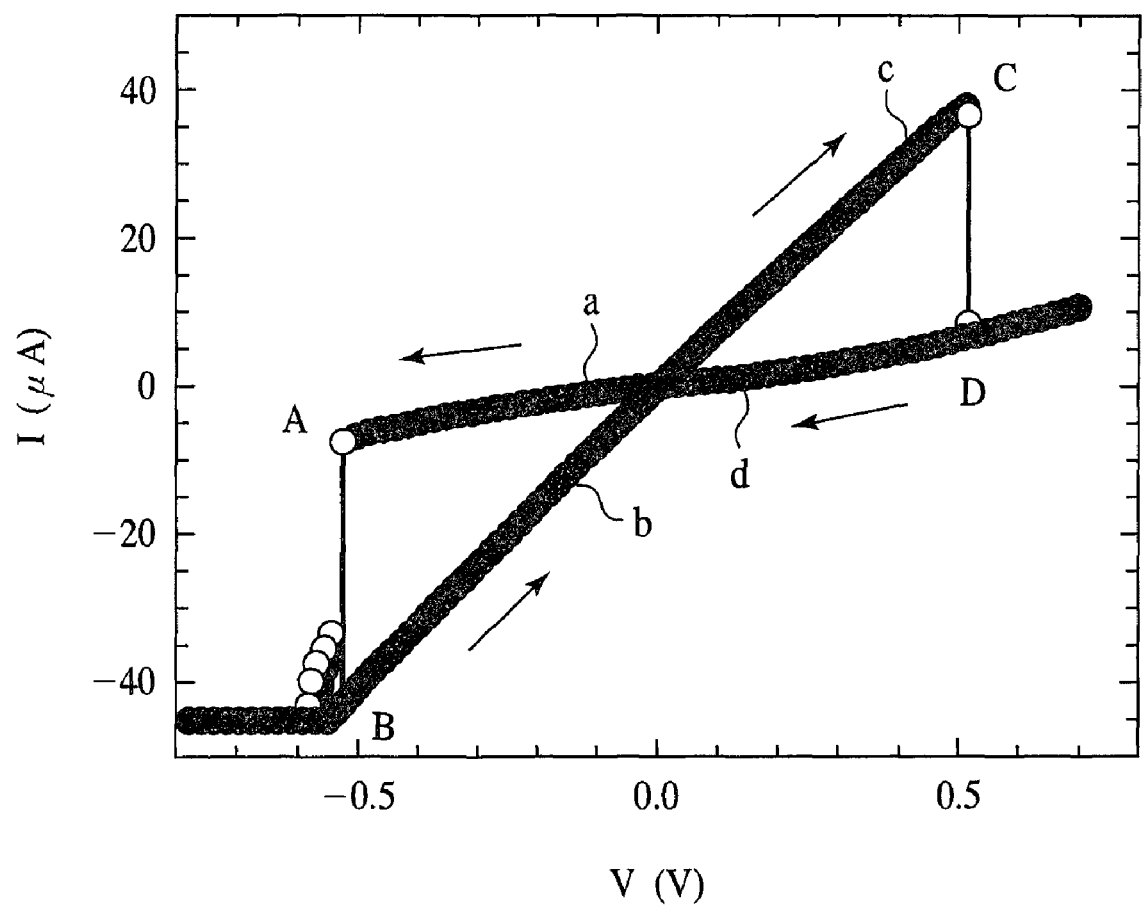
FIG. 1 is a graph showing the current-voltage characteristics of the resistance memory element using a bipolar resistance memory material.

FIG. 1 is a graph of the current-voltage characteristics of the resistance memory element using the bipolar resistance memory material and is disclosed in A. Beck et al., Appl. Phys. Lett., Vol. 77, p. 139 (2000). This graph is of the resistance memory element using Cr-doped $SrZrO_3$, which is the typical bipolar resistance memory material.

It is assumed that in the initial state, the resistance memory element is in the high resistance state.

As an applied voltage increases gradually from 0 V to negative voltages, the current flowing at this time changes along the curve "a" in the arrowed direction, and its absolute value gradually increases. When the applied negative voltage is further increased and exceed about −0.5 V, the resistance memory element switches from the high resistance state to the low resistance state. Accompanying this, the absolute value of the current abruptly increases, and the current-voltage characteristics transits from the point A to the point B. In the following explanation, the operation of changing the resistance memory element from the high resistance state to the low resistance state is called "set".

As the negative voltage is gradually decreased from the state at the point B, the current changes along the curve "b" in the arrowed direction, and its absolute value gradually decreases. When the applied voltage returns to 0 V, the current also becomes 0 A.

As the applied voltage increases gradually from 0 V to positive voltages, the current value changes along the curve "c" in the arrowed direction, and its absolute values gradually increases. The applied positive voltage further increases and exceeds about 0.5 V, the resistance memory element switches from the low resistance state to the high resistance state. Accompanying this, the absolute value of the current abruptly decreases, and the current-voltage characteristics transit from the point C to the point D. In the following explanation, the operation of changing the resistance memory element from the low resistance state to the high resistance state is called "reset".

As the positive voltage decreases from the state at the point D, the current changes along the curve "d" in the arrowed direction, and its absolute value gradually decreases. When the applied voltage returns to 0 V, the current also becomes 0 A.

The respective resistance states are stable in the range of about ±0.5 V and can be retained even when the electric power source is turned off. That is, in the high resistance state, when an applied voltage is lower than the absolute value of the voltage at the point A, the current-voltage characteristics changes linearly along the curves "a" and "d", and the high resistance state is retained. Similarly, in the low resistance state, when an applied voltage is lower than the absolute value of the voltage at the point C, the current-voltage characteristics changes linearly along the curves "b" and "c", and the low resistance state is retained.

As described above, for the resistance memory element using the bipolar resistance memory material, to change the resistance state between the high resistance state and the low resistance state, voltages of different polarities are applied.

Figure 2:
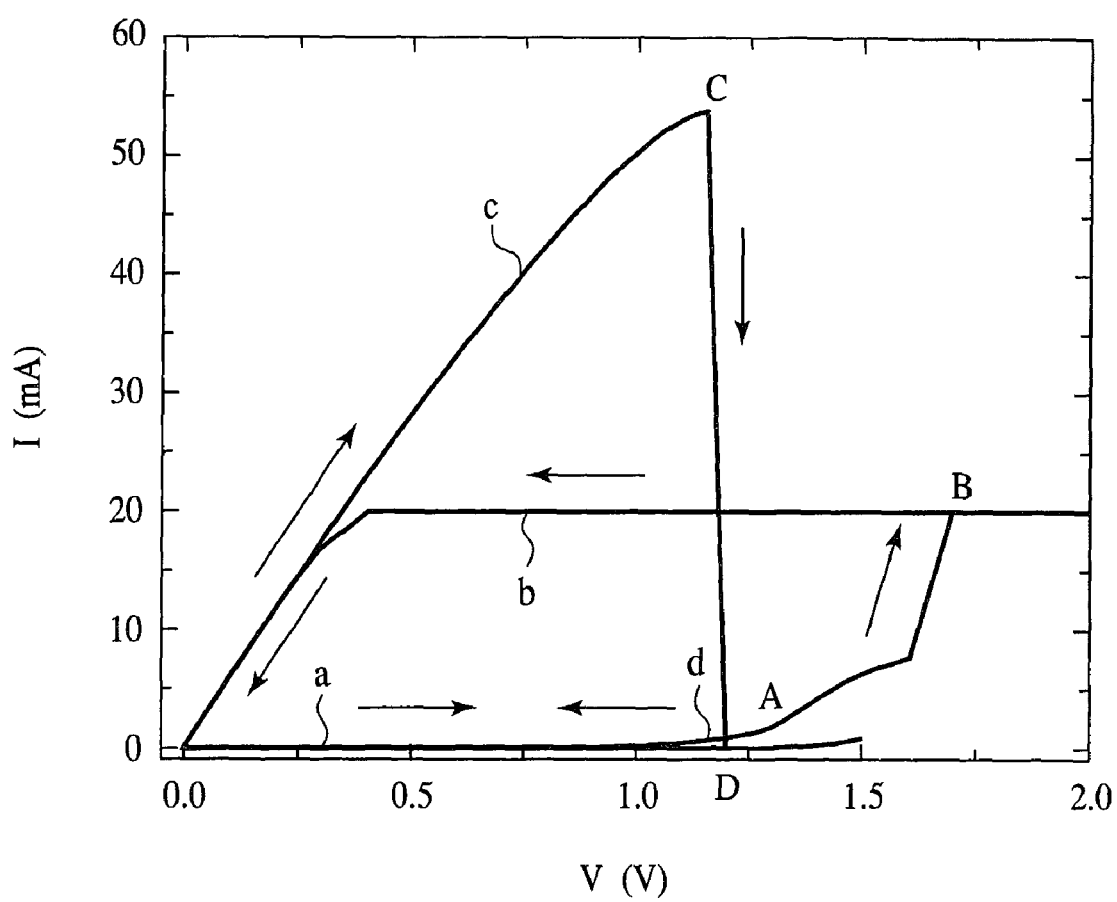
FIG. 2 is a graph showing the current-voltage characteristics of the resistance memory element using a unipolar resistance memory material.

FIG. 2 is a graph of the current-voltage characteristics of the resistance memory element using the unipolar resistance memory material. This graph is of the resistance memory element using $TiO_x$, which is the typical unipolar resistance memory material.

It is assumed that in the initial state, the resistance memory element is in the high resistance state.

As an applied voltage is increased gradually from 0 V, the current increases along the curve "a" in the arrowed direction, and its absolute value gradually increases. When the applied voltage gradually increases and exceeds about 1.3 V, the resistance memory element is switched from the high resistance state to the low resistance state (set). Accompanying this, the absolute value of the current abruptly increases, and the current-voltage characteristics transit from the point A to the point B. In FIG. 2, the current value at the point B is constantly about 20 mA because of the current limiter for preventing the element from breaking due to abrupt current increases.

As the voltage decreases gradually from the state at the point B, the current changes along the curve "b" in the arrowed direction, and its absolute value gradually decreases. When the applied voltage returns to 0 V, the current also becomes 0 A.

As the applied voltage again increases gradually from 0 V, the current changes along the curve "c" in the arrowed direction, and its absolute value gradually increases. When the applied positive voltage further increases and exceeds about 1.2 V, the resistance memory element is switched from the low resistance state to the high resistance state (reset). Accompanying this, the absolute value of the current abruptly decreases, and the current-voltage characteristics transits from the point C to the point D.

As the voltage is decreased gradually from the point D, the current changes in the arrowed direction along the curve "d", and the absolute value is gradually decreased. When the applied voltage returns to 0 V, the current also becomes 0 A.

The respective resistance states are stable not more than about 1.0 V and are retained when the electric power is turned off. That is, in the high resistance state, when the applied voltage is below the voltage at the point A, the current-voltage characteristics linearly change along the curve "a", and the high resistance state is retained. Similarly, in the low resistance state, when the applied voltage is below the voltage at the point C, the current-voltage characteristics change along the curve "c", and the low resistance state is retained.

As described above, in the resistance memory element using the unipolar resistance memory material, to change the resistance state between the high resistance state and the low resistance state, voltages of the same polarity are applied.

The resistance memory element formed of the above-described resistance memory material cannot have the characteristics shown in FIGS. 1 and 2 in the initial state immediately after the element formation. To make the resistance memory material reversibly changeable between the high resistance state and the low resistance state, the processing called "forming" is necessary.

Figure 3:
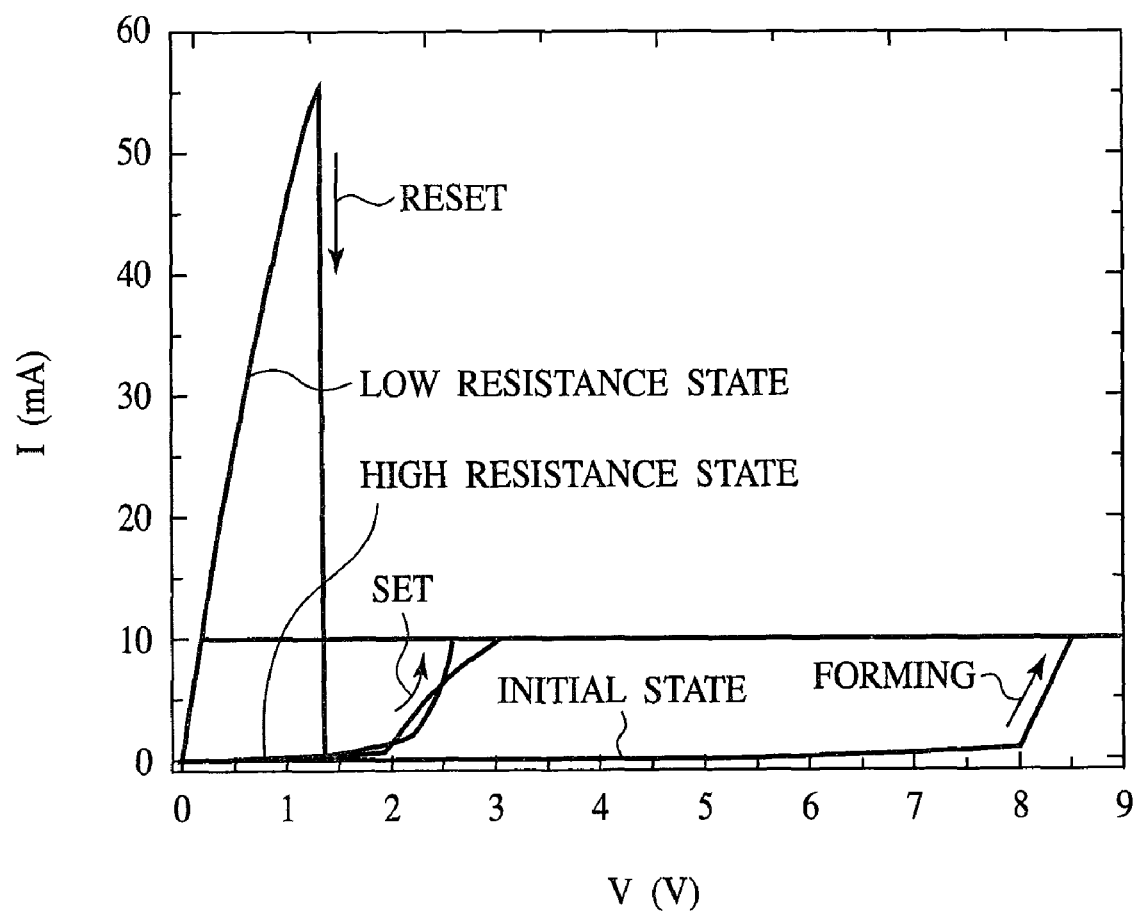
FIG. 3 is a graph showing the current-voltage characteristics explaining the forming processing of the resistance memory element.

FIG. 3 shows the current-voltage characteristics explaining the forming process of the resistance memory element using the same unipolar resistance memory material as in FIG. 2.

In the initial state immediately after the element has been formed, as shown in FIG. 3, the element is highly resistive and has a breakdown voltage of about 8 V which is very high. This breakdown voltage is very high in comparison with voltages necessary for the setting and resetting. In the initial state, changes of the resistance state, such as the setting and resetting, do not take place.

When a voltage higher than the breakdown voltage is applied in the initial state, as shown in FIG. 3, the value of the current flowing through the element abruptly increases, that is, the forming of the resistance memory element is made. Such forming is made, whereby the resistance memory element exhibits the current-voltage characteristics shown in FIG. 2 and can switch reversibly between the low resistance state and the high resistance state. Once subjected to the forming, the resistance memory element does not return to the initial state before the forming.

The resistance memory element in the initial state before subjected to the forming has a high resistance value, and this high resistance state might be misunderstood to be the high resistance state after the forming. In the specification of the present application, the high resistance state means the high resistance state of the resistance memory element after subjected to the forming, the low resistance state means the low resistance state of the resistance memory element after subjected to the forming, and the initial state is the state of the resistance memory element before subjected to the forming.

Next, the result of the mechanism of the forming the inventor of the present application investigated will be explained with reference to FIGS. 4 to 7. The sample used in the investigation was a resistance memory element including a lower electrode of a 150 nm-thickness Pt, a resistance memory layer of $TiO_x$ and an upper electrode of a 100 nm-thickness Pt.

Figure 4:
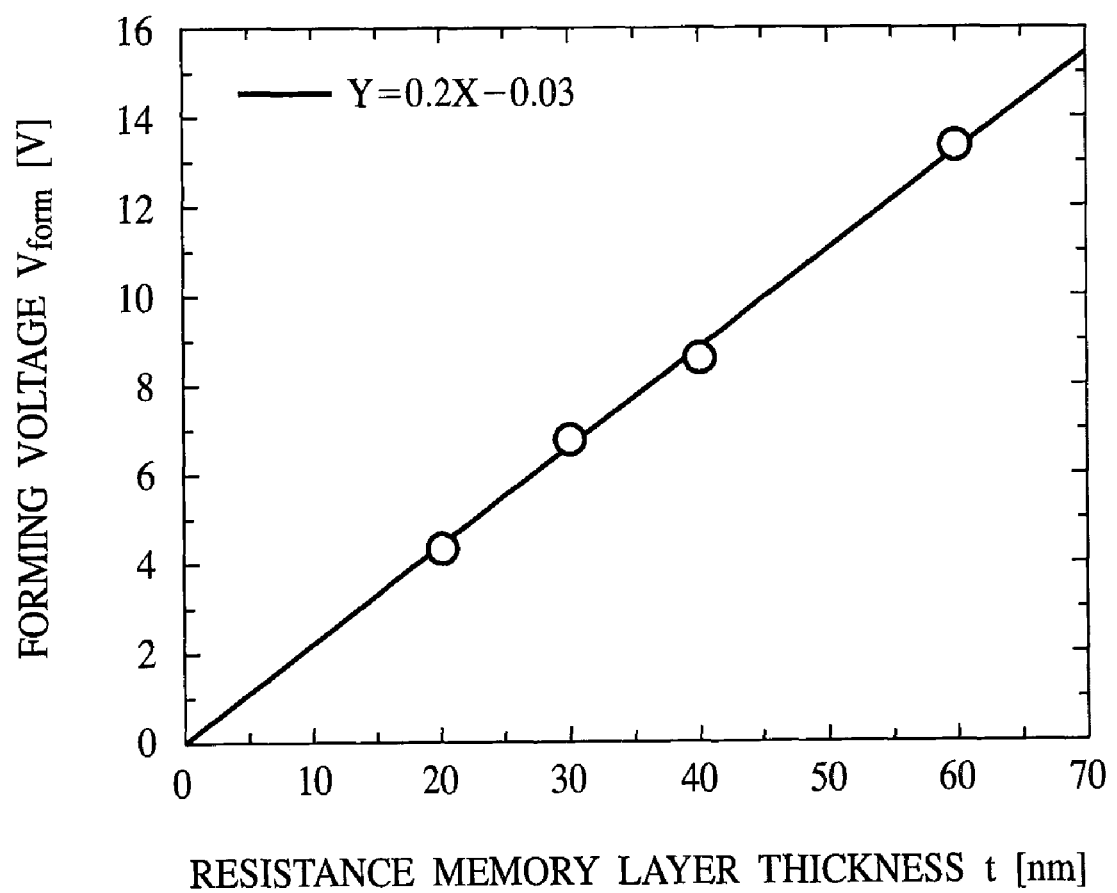
FIG. 4 is a graph showing the relationship between the voltage at which the forming takes place and the film thickness of the resistance memory layer.

FIG. 4 is a graph of the relationship between the voltage at which the forming takes place and the film thickness of the resistance memory layer. As shown in FIG. 4, the voltage at which the forming takes place (forming voltage) increases as the film thickness of the resistance memory layer increases. The measured points can be approximated linear, and the regression straight line passes the origin. This means that the voltage at which the forming takes place becomes zero at the limit. That is, the phenomenon of the forming will not be a phenomenon taking place at the interface between the electrode and the resistance memory layer but will be a phenomenon which takes place thickness-wise in the resistance memory layer.

Figure 5:
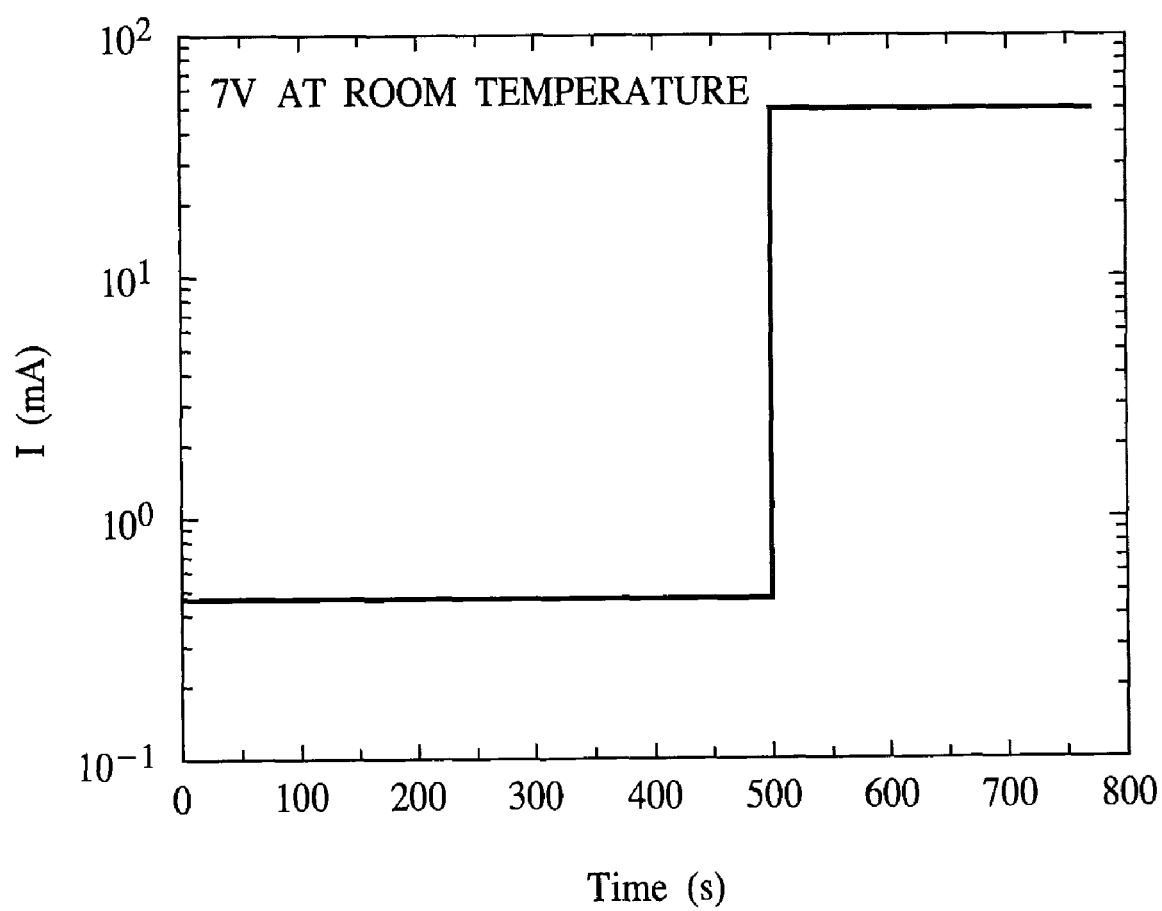
FIG. 5 is a graph showing the result of constant voltage TDDB measurement of the resistance memory element.

FIG. 5 is a graph showing the result of the constant voltage TDDB (time-dependent dielectric breakdown) measurement of the sample before the forming processing. The measurement was made at room temperature. The applied voltage was 7 V, and the film thickness of the resistance memory layer was 30 nm. As shown in FIG. 5, after about 500 seconds have passed, the current value abruptly increases, and it is found that the dielectric breakdown has taken place. I-V measurement of the resistance memory element after the dielectric breakdown has taken place was measured. The RRAM characteristics shown in FIG. 6 were confirmed, and it was confirmed that the sample has been subjected to the forming processing.

Figure 6:
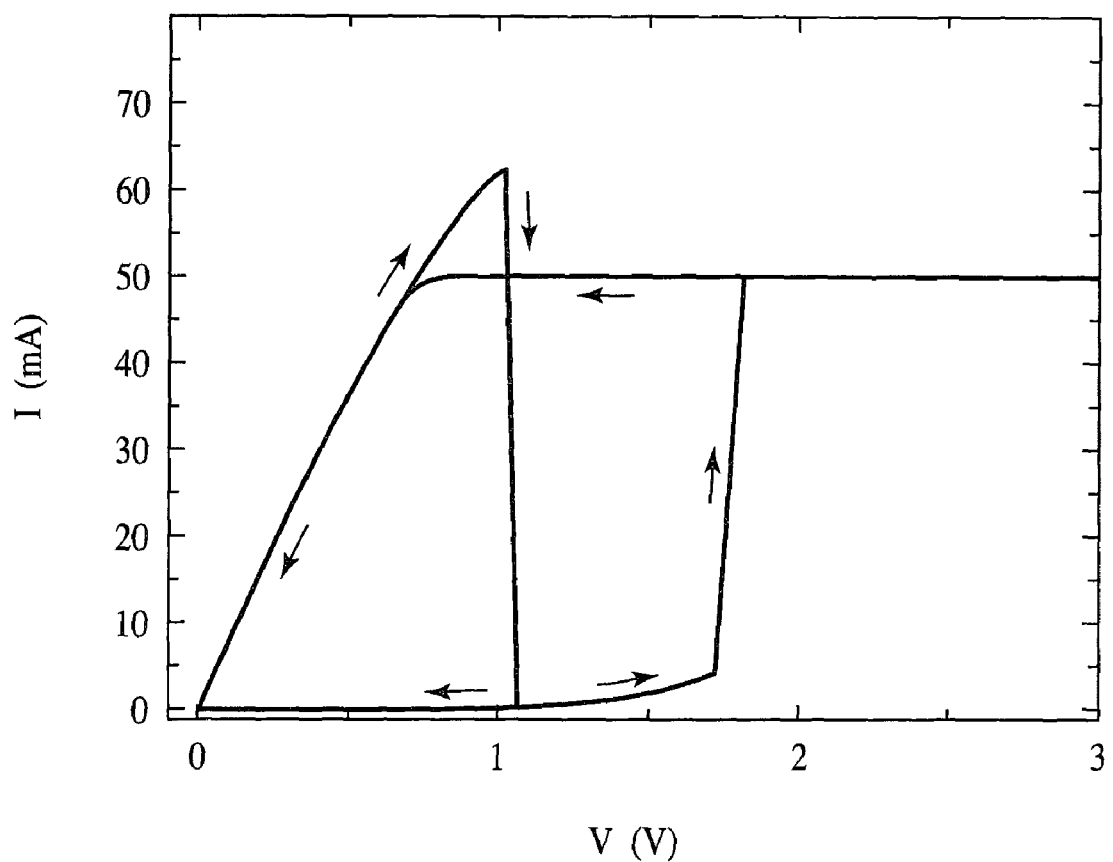
FIG. 6 is a graph showing the current-voltage characteristics of the resistance memory element used in investigating the mechanism of the forming.

In consideration of the results of FIGS. 4 to 6, the phenomenon of the forming is equivalent to the dielectric breakdown, and the dielectric breakdown will form a property changed region which is to be the current path.

Next, it will be explained that the RRAM characteristics as shown in FIG. 6 is caused by the property changed region.

First, a resistance memory element having a 500 μm-diameter of the upper electrode is formed and was subjected to the forming processing. Then, the resistance memory element was switched from the high resistance state to the low resistance state. The current-voltage characteristics of the resistance memory element at this time are indicated by the 0 marks in FIG. 7.

Then, this resistance memory element was cut in two pieces, and the current-voltage characteristics were again measured on the respective cut pieces. The current-voltage characteristics of the respective pieces are shown in FIG. 7 respectively by the dotted line and the solid line.

The result was that one piece (indicated by the dotted line) was in the low resistance state and well agreed with the measured data of the resistance memory element in the low resistance state set after the electrodes were cut. In contrast to this, the other piece (indicated by the solid line) remained in the state before the forming processing. Based on them, it is found that the current path generated by the forming is contained only in said one piece, and said one piece alone memorizes the resistance state before the electrodes were cut. The other piece does not contribute at all to memorizing the resistance state.

Based on the above-described result, the property changed region formed by the forming will be in a very narrow local region. In combination with the result of FIG. 4, this property changed region will be like a filament extended in the direction of film thickness of the resistance memory layer.

The RRAM characteristics of the resistance memory element will be generated in the filament shaped property changed region generated by the forming. Accordingly, the electric response changes before and after the switching are not substantially dependent on the electrode areas, as are in FeRAM and MRAM, and this permits the areas of the electrodes to be drastically reduced. A pair of electrodes may not be essentially arranged in parallel planes.

The mechanism for the filament shaped property changed region providing the RRAM characteristics is not clear, but the inventor of the present application presumes as follows.

A resistance memory element is formed and is subjected to the forming processing to generate the dielectric breakdown, and then the filament shaped property changed region is formed in the resistance memory layer. A current path is formed in this property changed region. This state is the low resistance state of the resistance memory element.

When a voltage is applied to the resistance memory element in the low resistance state, a current flows via the current path. When the value of the current becomes large, an oxidation reaction similar to the anodic oxidation takes place and acts to restore the property changed region. Thus, the property-changed region is decreased, which makes the current path narrow, or oxidation advances around a vicinity of the interface of the pass with the electrode, which blocks the current path, and a high resistance state is generated. This state is the high resistance state of the resistance memory element. The region when the current path is blocked will be the memory region for memorizing the high resistance state or the low resistance state.

When a voltage of not less than the prescribed value to the resistance memory element in the high resistance state, dielectric breakdown takes place in the oxidized region blocking the current path, and the current path is again formed. Thus, the resistance memory element returns to the low resistance state.

Figure 8A:
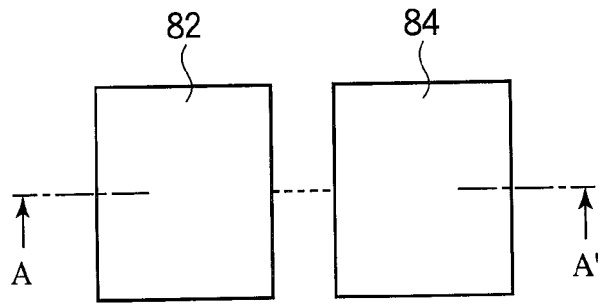
FIGS. 8A-8C are plan views showing the arrangement examples of the electrodes of the resistance memory element.
Figure 8B:
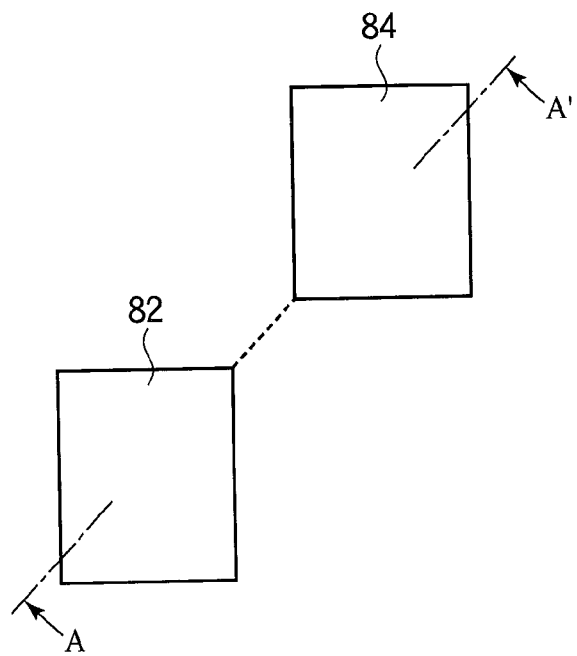
Figure 8C:
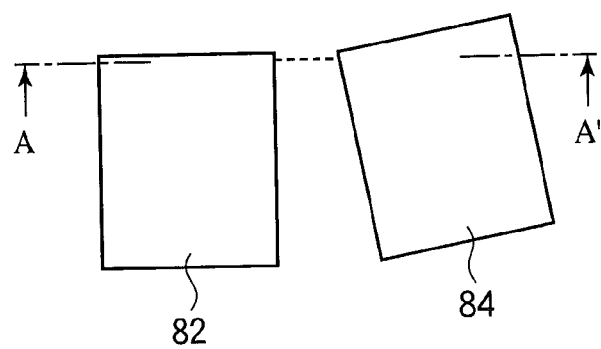
Figure 9A:
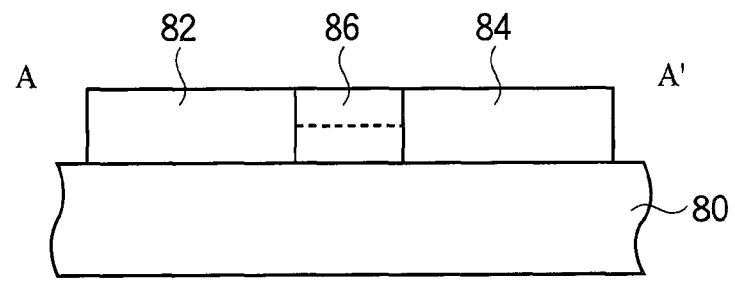
FIGS. 9A-9C are diagrammatic sectional views showing the arrangement examples of the electrodes of the resistance memory element.
Figure 9B:
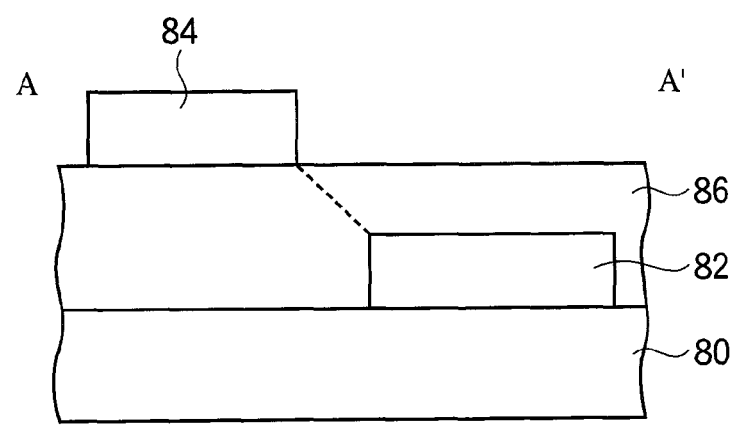
Figure 9C:
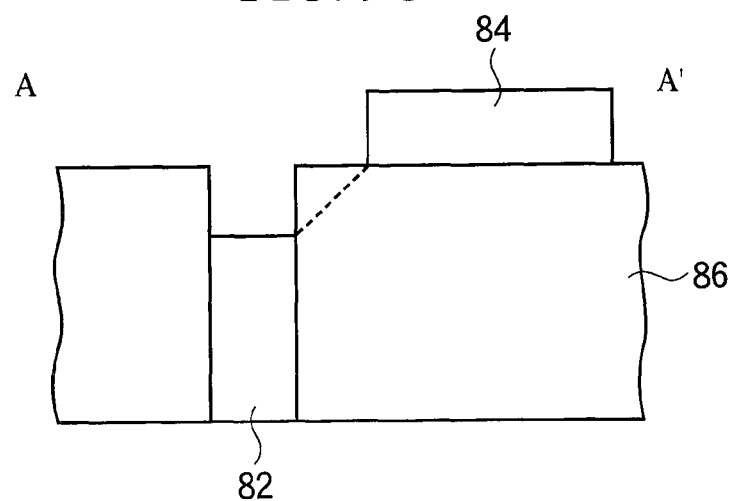

FIGS. 8A-9C are examples of the layout of a pair of electrodes sandwiching the resistance memory layer. FIGS. 8A-8C are plan views, and FIGS. 9A-9C are sectional views. In the respective views, the dotted lines indicate the typical current path formed by the forming. It is supposed that actually, however, the current path will have curved shapes under the influence of crystal grain boundaries, or a plurality of current paths will be coincidentally present.

The layout view of FIG. 8A is of a pair of electrodes 82, 84 arranged with the opposed sides being in parallel with each other. The layout view of FIG. 8B is of a pair of electrodes 82, 84 arranged with one corners opposed to each other. FIG. 8C is of a pair of electrodes 82, 84 with the opposed sides in non-parallel with each other.

The layout view of FIG. 9A is of the case that a pair of electrodes 82, 84 are formed on the same plane of a substrate 80, and a resistance memory layer 86 is formed between the electrodes 82, 84. In this case, the current path is formed in the layer direction of the resistance memory layer 86. In the present specification, the direction of the current path means a direction along the straight line interconnecting the start point of the current path and the end point thereof. The layer direction means a direction along the plane where the resistance memory layer 86 is formed.

In the layout view of FIG. 9B, a pair of electrodes 82, 84 are formed on different planes, sandwiching the resistance memory layer 86. In the layout view of FIG. 9C, one of a pair of electrodes 82, 84 is formed on the side wall of the resistance memory layer 86 (e.g., in a contact hole), and the other electrode 84 is formed on the resistance memory layer 86. In this case, the current path is formed in the direction of the thickness of the resistance memory layer 86.

The plane layouts of FIGS. 8A-8C and the sectional layouts of FIGS. 9A-9C can be arbitrarily combined.

The electrodes 82, 84 sandwiching the resistance memory layer 86 may not be provided essentially 1:1, and a plurality of discrete electrodes may be provided for one common electrode.

A First Embodiment

The nonvolatile semiconductor memory device and the method of manufacturing the same according to a first embodiment of the present invention will be explained with reference to FIGS. 10 to 13E.

First, the structure of the nonvolatile semiconductor memory device according to the present embodiment will be explained with reference to FIGS. 10 to 12. FIG. 11 is the sectional view along the line A-A' in FIG. 10.

Figure 10:
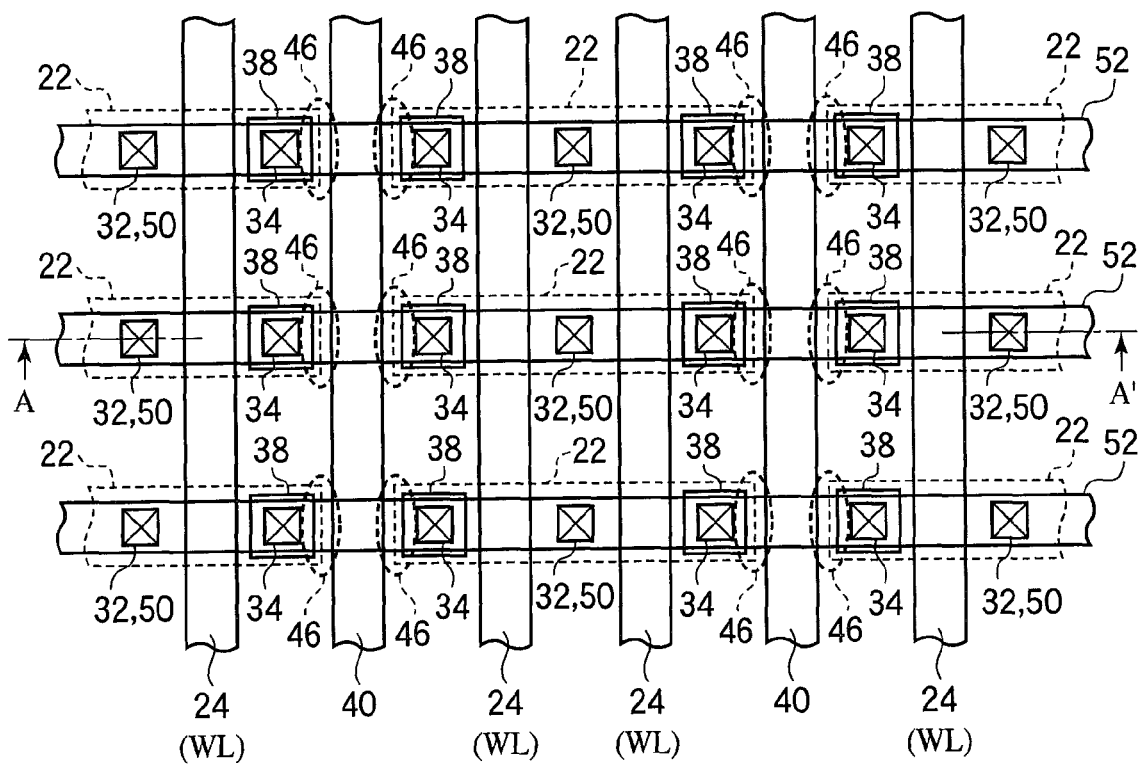
FIG. 10 is a plan view showing the structure of the nonvolatile semiconductor memory device according to a first embodiment of the present invention.
Figure 11:
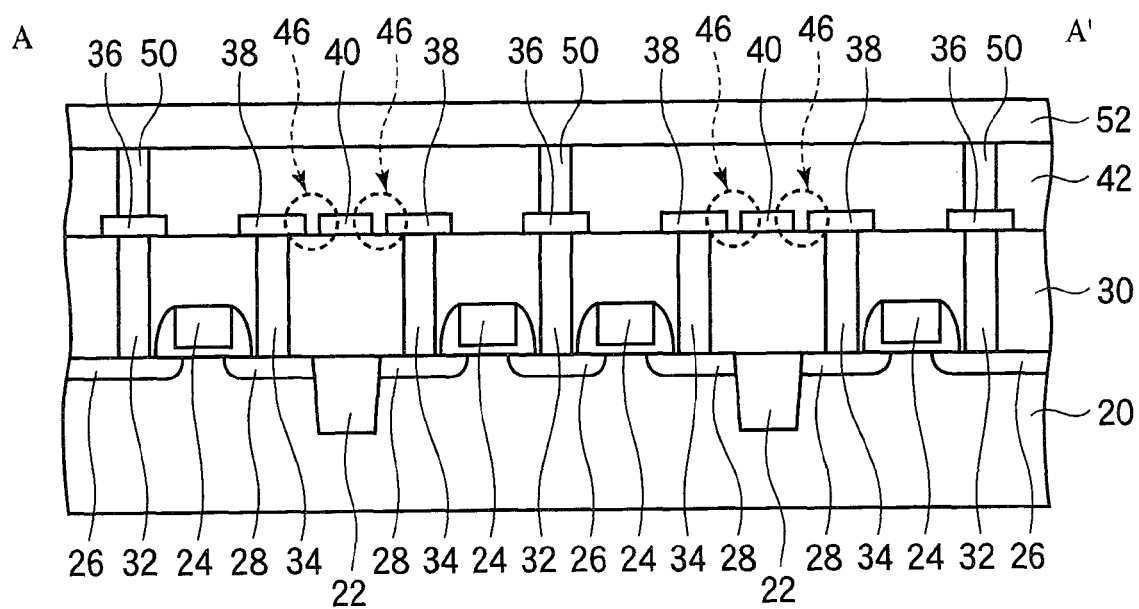
FIG. 11 is a diagrammatic sectional view showing the structure of the nonvolatile semiconductor memory device according to the first embodiment of the present invention.

As shown in FIGS. 10 and 11, a device isolation film 22 for defining device regions is formed in a silicon substrate 20. In the device regions of the silicon substrate 20, cell select transistors each including a gate electrode 24 and source/drain regions 26, 28 are formed.

As shown in FIG. 10, the gate electrodes 24 function also as word lines WL commonly connecting the gate electrodes 24 of the cell select transistors adjacent column-wise (vertically in the drawing).

Over the silicon substrate 20 with the cell select transistors formed on, an inter-layer insulating film 30 with contact plugs 32 electrically connected to the source/drain region 26 and contact plugs 34 connected to the source/drain regions 28 buried in is formed. Over the inter-layer insulating film 30, interconnections 36 electrically connected to the source/drain regions 26 via the contact plugs 32, electrodes 38 electrically connected to the source/drain regions 28 via the contact plugs 34, and source lines 40 disposed between the electrodes 38 adjacent to each other are formed. The electrodes 38 are formed one for each contact plug 34. The source lines 40 are extended column-wise as shown in FIG. 10.

Over the inter-layer insulating film 30 with the interconnections 36, the electrodes 38 and the source lines 40 formed on, a resistance memory layer 42 of a resistance memory material is formed. The resistance memory material can be either the bipolar resistance memory material or the unipolar resistance memory material. Thus, the electrodes 38 and the source lines 40 are arranged with the side surfaces opposed to each other via the resistance memory layer 42, and resistance memory elements 46 each including the electrode 38 and the source line 40 as a pair of electrodes are formed (enclosed by the dotted lines in the drawing). As shown in FIG. 10, each source line 40 functions as a common electrode of two resistance memory elements 46 adjacent to each other across the source line 40 and of one electrodes of a plurality of the resistance memory elements 46 arranged column direction with respect to said two resistance memory elements.

In the resistance memory layer 42, contact plugs 50 electrically connected to the interconnections 36 are buried. Over the resistance memory layer 42 with the contact plugs 50 buried in, bit lines 52 electrically connected to the source/drain regions 26 via the contact plugs 50, the interconnections 36 and the contact plugs 32 and extended in the row direction crossing the word lines WL (horizontally in the drawing) are formed.

As described above, the nonvolatile semiconductor memory device according to the present embodiment is characterized mainly in that the resistance memory element 46 includes a pair of electrodes (the electrode 38 and the source line 40) formed of the same conductive layer on the same plane, and the resistance memory layer 42 formed between the pair of electrodes.

As described above, the property changed region of the resistance memory layer formed by the forming is generated in a local very narrow region, which allows the electrode area of a pair of electrodes sandwiching the resistance memory layer 46 to be formed drastically smaller than in DRAM, FeRAM, etc. and makes it possible to use the side surfaces of the interconnection layer to be used as the electrode surface, as in the resistance memory element according to the present embodiment.

The resistance memory element has such constitution, whereby a pair of electrodes can be formed of the same conductive layer concurrently formed on the same surface. This can simplify the manufacturing process of the resistance memory element.

In the nonvolatile semiconductor memory device according to the present embodiment, the current path to be formed by the forming is formed in the layer-wise direction of the resistance memory layer 42 in the resistance memory layer 42 between the electrode 38 and the source line 40 (see FIG. 9A).

The interconnection 36 and the electrode 38 must be arranged at an interval which does not cause the forming in the resistance memory layer 42 between the interconnection 36 and the electrode 38 upon a data rewriting. That is, the interval between the interconnection is set so that a voltage causing the forming in the resistance memory layer 42 between the interconnection 36 and the electrode 38 is larger than a maximum applied voltage difference between the electrode 38 and the source line 40 upon a data rewriting.

The maximum voltage to be applied between the electrode 38 and the source line 40 upon a data rewriting of the resistance memory element 46 is about 1.7 V for the resistance memory element 46 having characteristics of, e.g., FIG. 6 when the maximum voltage difference is the rewriting voltage (set voltage) of the resistance memory element 46. The film thickness of the resistance memory layer 42 computed from the graph of FIG. 4 when the voltage causing the forming is 1.7 V is about 9 nm. That is, if an interval between the interconnection 36 and the electrode 38, which is larger than 9 nm is ensured, the forming never takes place in the resistance memory layer 42 between the interconnection 36 and the electrode 38 even when a voltage equivalent to a set voltage or reset voltage between the interconnection 36 and the electrode 38 is applied.

It is also effective to make the interval between the interconnection 36 and the electrode 38 larger than an interval between the electrode 38 and the source line 40. This makes a voltage causing the forming in the resistance memory layer 42 between the interconnection 36 and the electrode 38 larger than a voltage causing the forming in the resistance memory layer 42 between the electrode 38 and the source line 40, whereby the forming is effectively prevented from taking place in the resistance memory layer 42 between the interconnection 36 and the electrode 38 upon a data rewriting of the resistance memory element 46 and upon the forming.

It is preferable that the interval between the interconnection 36 and the electrode 38 is set suitably depending on a structure and constituent materials of the resistance memory element 46, the voltage application methods for the data rewriting, etc.

As shown in FIGS. 10 and 11, the memory cell 10 of the nonvolatile semiconductor memory device according to the present embodiment includes the resistance memory element 12 and the cell select transistor 14. The resistance memory element 12 has one end connected to the source line SL and the other end connected to the source terminal of the cell select transistor 14. The cell select transistor 14 has the drain terminal connected to the bit line BL and the gate terminal connected to the word line WL. Such memory cells 10 are formed adjacent to each other column-wise (vertically in the drawing) and row-wise (horizontally in the drawing).

A plurality of word lines WL1, /WL, WL2, /WL2, . . . are arranged column-wise, forming common signal lines for the memory cells 10 arranged column-wise. Source lines SL1, SL2, . . . are arranged column-wise and form signal lines common among the memory cells 10 arranged column-wise. The source lines SL are provided one for two word lines WL.

A plurality of bit lines BL1, BL2, BL3, BL4, . . . are arranged row-wise (horizontally in the drawing) and form signal lines common among the memory cells arrange row-wise.

Next, the writing method of the nonvolatile semiconductor memory device according to the present embodiment will be explained with reference to FIG. 10. It is assumed here that the forming process of the resistance memory element has been done.

First, the rewriting operation from the high resistance state to the low resistance state, i.e., the operation of the set will be explained. The memory cell 10 to be written is a memory cell 10 connected to the word line WL1 and the bit line BL1.

First, a prescribed voltage is applied to the word line WL1 to turn on the cell select transistor 14. The source line SL1 is connected to a reference potential, e.g., 0 V, which is the ground potential.

Next, to the bit line BL1, a bias voltage which is the same as or a little larger than a voltage necessary to set the resistance memory element 12 is applied. For the resistance memory element having the characteristics of, e.g., FIG. 6, a bias voltage of, e.g., about 2 V is applied.

Thus, the current path to the source line SL1 via the bit line BL1, the cell select transistor 14 and the resistance memory element 12 is formed, and the applied bias voltage is divided to the resistance memory element 12 and the cell select transistor 14 corresponding to a resistance value $R_H$ of the resistance memory element 12 and a channel resistance $R_{CS}$ of the cell select transistor 14.

At this time, because of the resistance value $R_H$ of the resistance memory element 12 which is sufficiently larger than the channel resistance $R_{CS}$ of the cell select transistor, most of the bias voltage is applied to the resistance memory element 12. Thus, the resistance memory element 12 is changed from the high resistance state to the low resistance state.

Then, after the bias voltage to be applied to the bit line BL1 is returned to zero, the voltage to be applied to the word line WL1 is turned off, and the operation of the set is completed.

Figure 12:
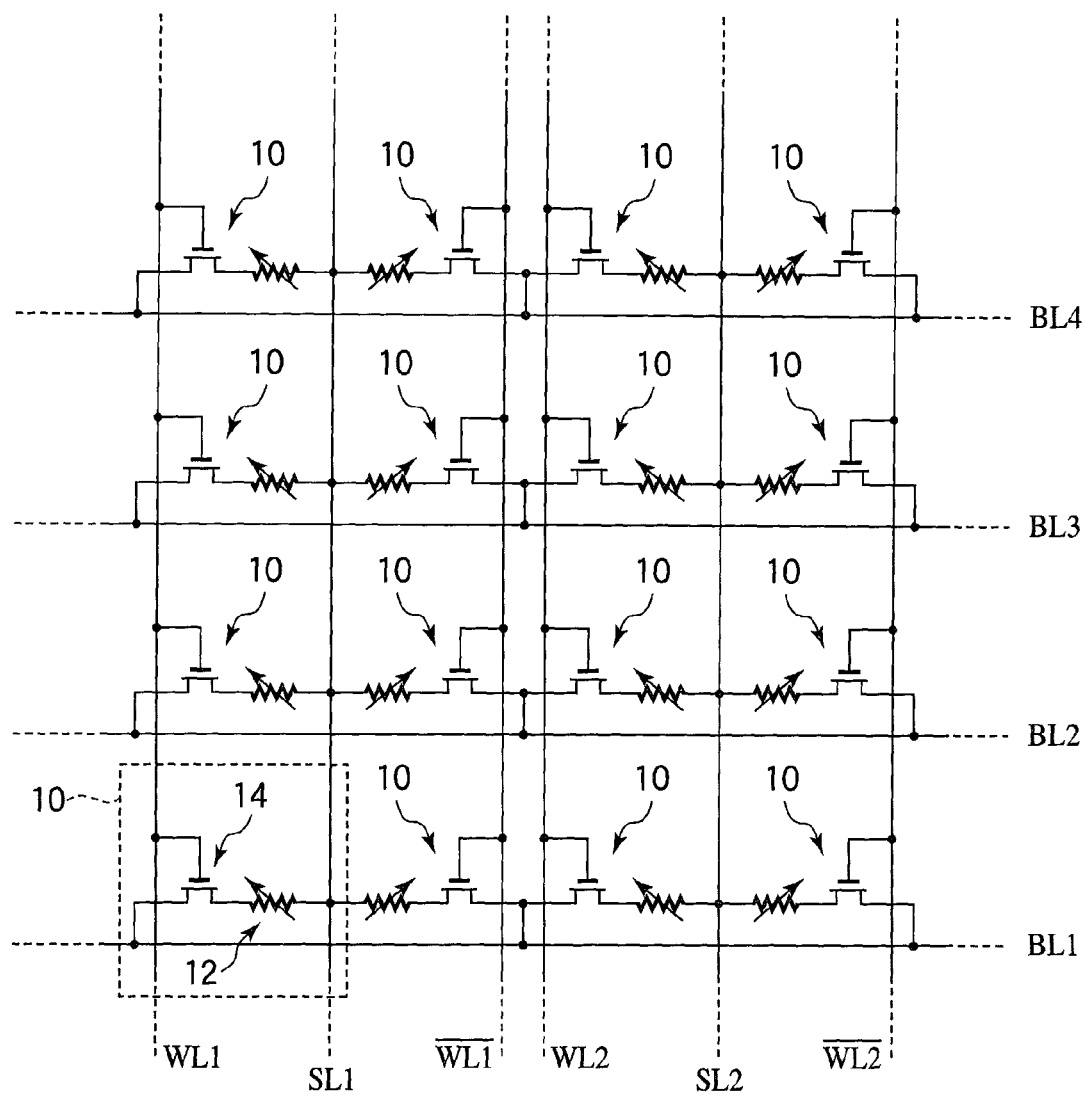
FIG. 12 is a circuit diagram showing the structure of the nonvolatile semiconductor memory device according to the first embodiment of the present invention.

In the nonvolatile semiconductor memory device according to the present embodiment, as shown in FIG. 12, the word lines WL and the source SL are arranged column-wise, and the memory cells 10 connected to one word line (e.g., the word line WL1) are connected to the same source line SL (e.g., SL1). Accordingly, a plurality of the bit lines (e.g., BL1-BL4) are simultaneously driven, whereby a plurality of the memory cells 10 connected to a selected word line (e.g., the word line WL1) can be set at once.

Next, the rewriting operation from the low resistance state to the high resistance state, i.e., the operation of the reset will be explained. The memory cell 10 to be written is a memory cell 10 connected to the word line WL1 and the bit line BL1.

First, a prescribed voltage is applied to the word line WL1 to turn on the cell select transistor 14. At this time, the voltage to be applied to the word line WL1 is controlled so that the channel resistance $R_{CS}$ of the cell select transistor 14 becomes sufficiently smaller than a resistance value $R_L$ of the resistance memory element 12 in the low resistance state. The source line SL1 is connected to a reference potential, e.g., 0 V, which is the ground potential.

Then, a bias voltage which is the same as or a little larger than a voltage necessary to reset the resistance memory element 12 is applied to the bit line BL1. For the resistance memory element having the characteristics of, e.g., FIG. 6, a bias voltage of, e.g., about 1.2 V is applied.

Thus, the current path to the source line SL1 via the bit line BL1, the cell select transistor 14 and the resistance memory element 12 is formed, and the applied bias voltage is divided to the resistance memory element 12 and the cell select transistor 14 respectively corresponding to the resistance value $R_L$ of the resistance memory element 12 and the channel resistance $R_{CS}$ of the cell select transistor 14.

At this time, because of the channel resistance $R_{CS}$ of the cell select transistor 14 which is sufficiently smaller than the resistance value $R_L$ of the resistance memory element 12, most of the applied bias voltage is applied to the resistance memory element 12. Thus, the resistance memory element 12 is changed from the low resistance state to the high resistance state.

In the reset process, the instance the resistance memory element 12 has been switched to the high resistance state, almost all the bias voltage is divided to the resistance memory element 12, and it is necessary to prevent the resistance memory element 12 from being set again by this bias voltage. To this end, the bias voltage to be applied to the bit line BL must be smaller than a voltage necessary for the set.

That is, in the reset process, to make the channel resistance $R_{CS}$ of the cell select transistor 14 sufficiently smaller than the resistance value $R_L$ of the resistance memory element 12, the gate voltage of the cell select transistor 14 is adjusted, and furthermore, the bias voltage to be applied to the bit line BL is set at not less than a voltage necessary for the reset and less than a voltage necessary for the set.

Then, after the bias voltage to be applied to the bit line BL1 has been returned to zero, the voltage to be applied to the word line WL is turned off, and the operation for the reset is completed.

In the nonvolatile semiconductor memory device according to the present embodiment, as shown in FIG. 12, the word lines WL and the source lines SL are arranged column-wise, and the memory cells to connected to the same word line (e.g., WL1) are connected to the same source line SL (e.g., SL1). Accordingly, in the above-described reset operation, a plurality of the bit lines BL (e.g., BL1-BL4) are simultaneously driven, whereby a plurality of the memory cells connected to a selected word line (e.g., WL1) can be reset at once.

Then, the reading method of the nonvolatile semiconductor memory device according to the present embodiment will be explained with reference to FIG. 12. The memory cell to be read is a memory cell connected to the word line WL1 and the bit line BL1.

First, a prescribed voltage is applied to the word line WL1 to turn on the cell select transistor 14. At this time, the voltage to be applied to the word line WL1 is controlled so that the channel resistance $R_{CS}$ of the cell select transistor 14 becomes sufficiently smaller than a resistance value $R_L$ of the resistance memory element 12 in the low resistance state. The source line SL1 is connected to a reference potential, e.g., 0 V, which is the ground potential.

Then, a prescribed bias voltage is applied to the bit line BL1. This bias voltage is set so that the resistance memory element 12 is neither set nor reset in either state. For example, when the resistance memory element 12 has the current-voltage characteristics of FIG. 2, with the bias voltage of less than about 1.2 V, neither the set nor the reset takes place. Accordingly, the bias voltage for the reading is set at a voltage which ensures a sufficient margin with a voltage of less than 1.2 V, e.g., 0.5 V.

When such bias voltage is applied to the bit line BL1, current corresponding to a resistance value of the resistance memory element 12 flows in the bit line BL1. This current flowing in the bit line BL1 is detected, whereby it can be read which resistance state the resistance memory element 12 has.

Next, the method for manufacturing the nonvolatile semiconductor memory device according to the present embodiment will be explained with reference to FIGS. 13A and 13E.

First, in a silicon substrate 20, a device isolation film 22 for defining device regions is formed by, e.g., STI (Shallow Trench Isolation) method.

Figure 13A:
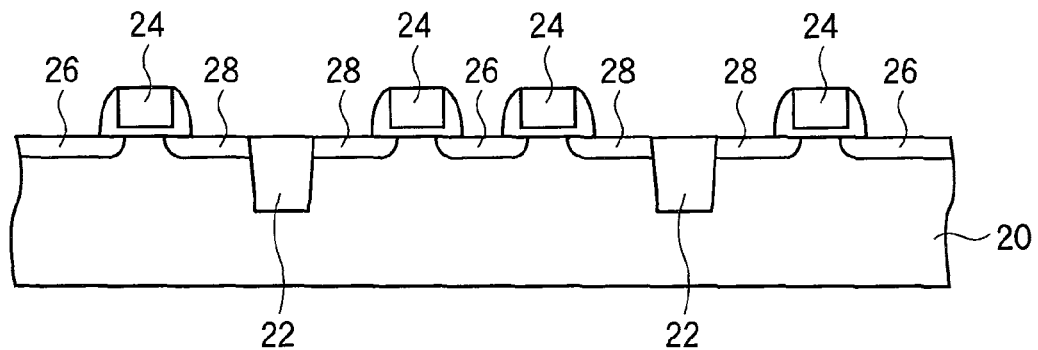
FIGS. 13A-13E are sectional views showing the method of manufacturing the nonvolatile semiconductor memory device according to the first embodiment of the present invention.

Next, over the device region of the silicon substrate 20, the cell select transistors each including the gate electrode 24 and the source/drain regions 26, 28 are formed in the same way as in the method for manufacturing the usual MOS transistor (FIG. 13A).

Next, over the silicon substrate 20 with the cell select transistors formed on, a silicon oxide film is deposited by, e.g., CVD method to form the inter-layer insulating film 30 of the silicon oxide film.

Next, by photolithography and dry etching, in the inter-layer insulating film 30, contact holes are formed down to the source/drain regions 26, 28.

Figure 13B:
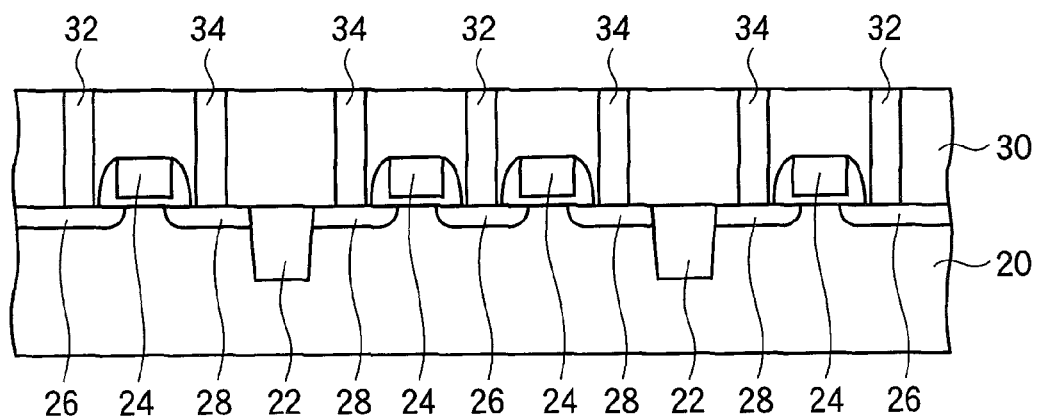

Then, a barrier metal and a tungsten film are deposited by, e.g., CVD method, and these conductive films are etched back to form in the contact holes the contact plugs 32, 34 electrically connected to the source/drain regions 26, 28 (FIG. 13B).

Next, over the inter-layer insulating film 30 with the contact plugs 32, 34 buried in, a platinum (Pt) film is deposited by, e.g., CVD method.

Figure 13C:
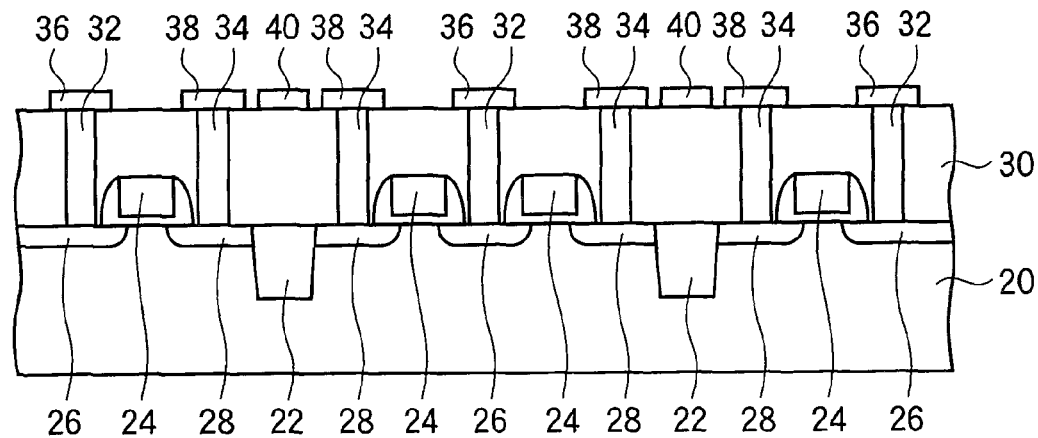

Then, by photolithography and dry etching, the platinum film is patterned to form the interconnections 36 electrically connected to the source/drain regions 26 via the contact plugs 32, the electrodes 38 electrically connected to the source/drain regions 28 via the contact plugs 34 and the source lines 40 formed between the electrodes 38 (FIG. 13C).

Then, over the inter-layer insulating film 30 with the interconnections 36, the electrodes 38 and the source lines 40 formed on, a $TiO_x$ film is deposited by laser abrasion method, sol-gel method, sputtering method, MOCVD method or others to form the resistance memory layer 42 of the $TiO_x$ film. Over the resistance memory layer 42, an insulating film of silicon oxide film or others may be further deposited.

Then, by photolithography and dry etching, in the resistance memory layer 42, contact holes are formed down to the interconnections 36.

Figure 13D:
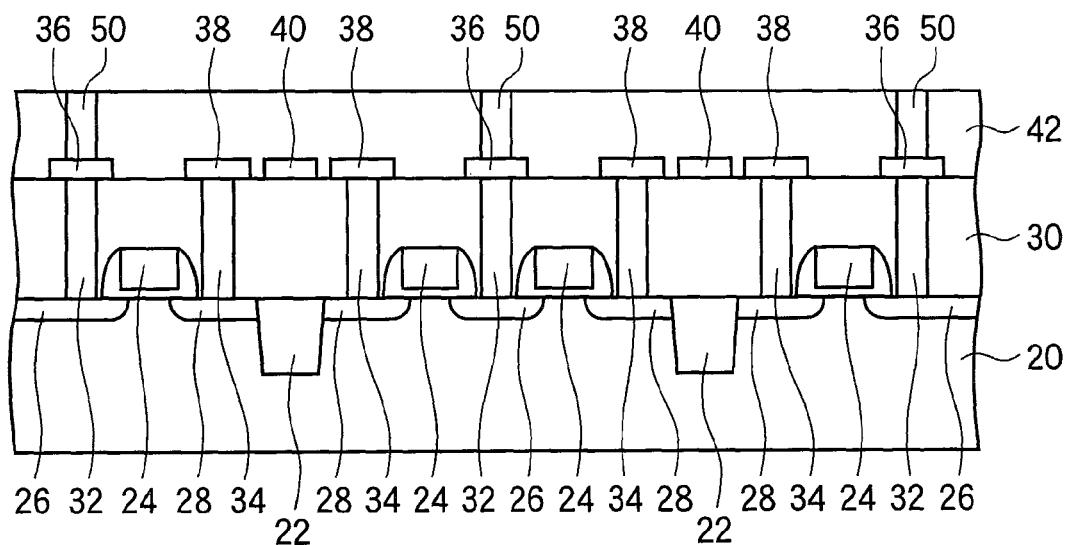

Next, by, e.g., CVD method, a barrier metal and a tungsten film are deposited, and these conductive films are etched back to form in the contact holes the contact plugs 50 electrically connected to the interconnections 36 (FIG. 13D).

Figure 13E:
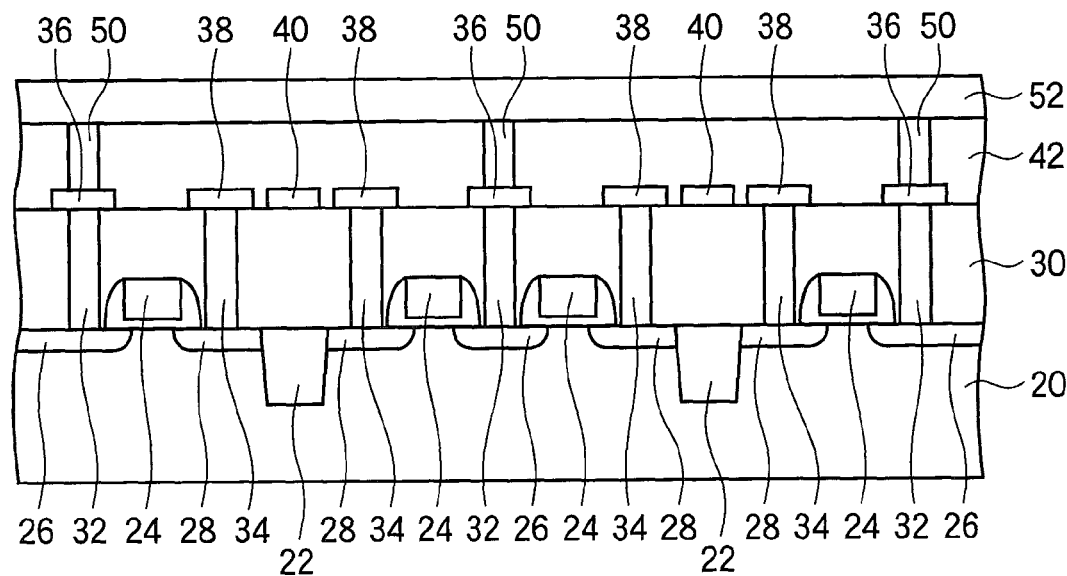

Next, a conductive film is deposited on the resistance memory layer 42 with the contact plugs 50 buried in, and then by photolithography and dry etching, this conductive film is patterned to form the bit lines 52 electrically connected to the source/drain regions 26 via the contact plugs 50, the interconnections 36 and the contact plugs 32 (FIG. 13E).

Then, upper-level interconnection layers are further formed as required, and the nonvolatile semiconductor memory device is completed.

As described above, according to the present embodiment, the resistance memory element includes a pair of electrodes of the same conductive layer formed on the same plane, and the resistance memory layer formed between the pair of electrodes, which allows the process of manufacturing the resistance memory element to be simpler in comparison with the process wherein the electrodes of a pair are separately formed. In comparison with the process wherein the electrodes of a pair are stacked thickness-wise to thereby form the resistance memory element, the planarity of the resistance memory element is improved, whereby the process of forming upper-level interconnection layers, etc. can be simplified by the omission of the planarization step, etc.

One of the resistance memory element can be formed integral with the signal line (source line) connected to the memory cell. This permits the process of manufacturing the resistance memory element to be simplified.

A Second Embodiment

The nonvolatile semiconductor memory device and the method of manufacturing the same according to a second embodiment of the present invention will be explained with reference to FIGS. 14 to 17E. The same members of the nonvolatile semiconductor memory device and the method of manufacturing the same according to the first embodiment shown in FIGS. 10 to 13E are represented by the same reference numbers not to repeat or to simplify their explanation.

First, the structure of the nonvolatile semiconductor memory device according to the present embodiment will be explained with reference to FIGS. 14 to 16. FIG. 15 is the sectional view along the line A-A' in FIG. 14.

Figure 14:
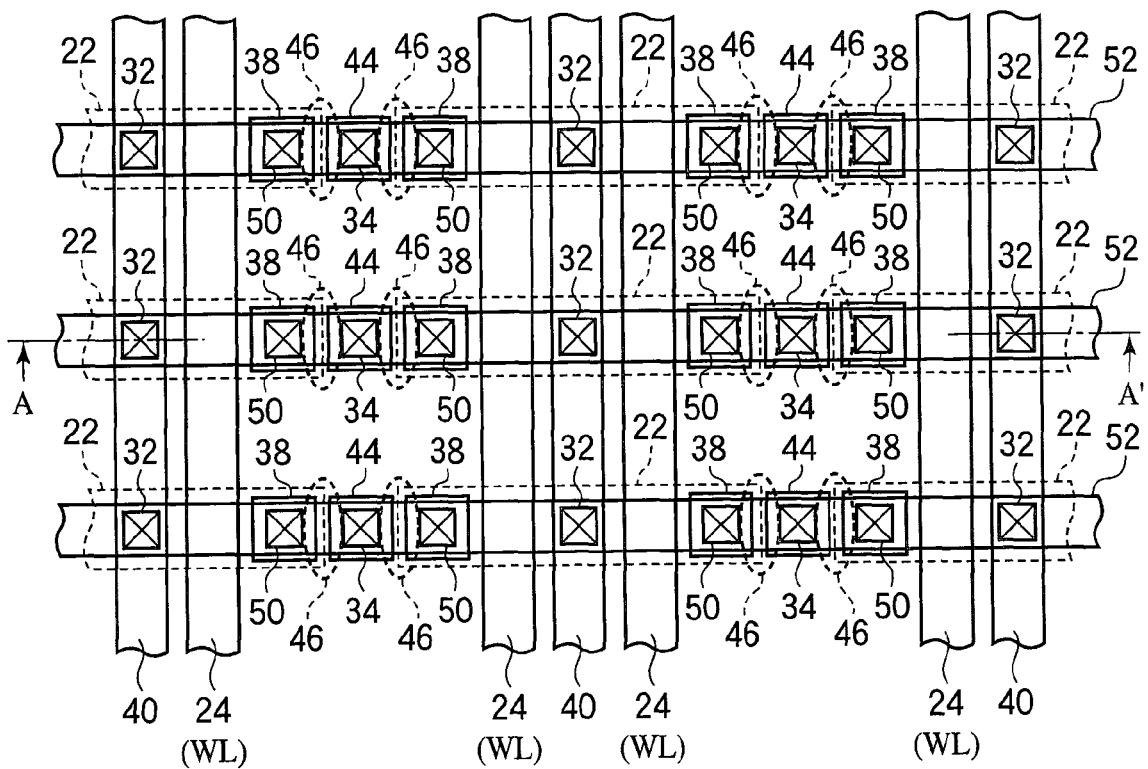
FIG. 14 is a plan view showing the structure of the nonvolatile semiconductor memory device according to a second embodiment of the present invention.
Figure 15:
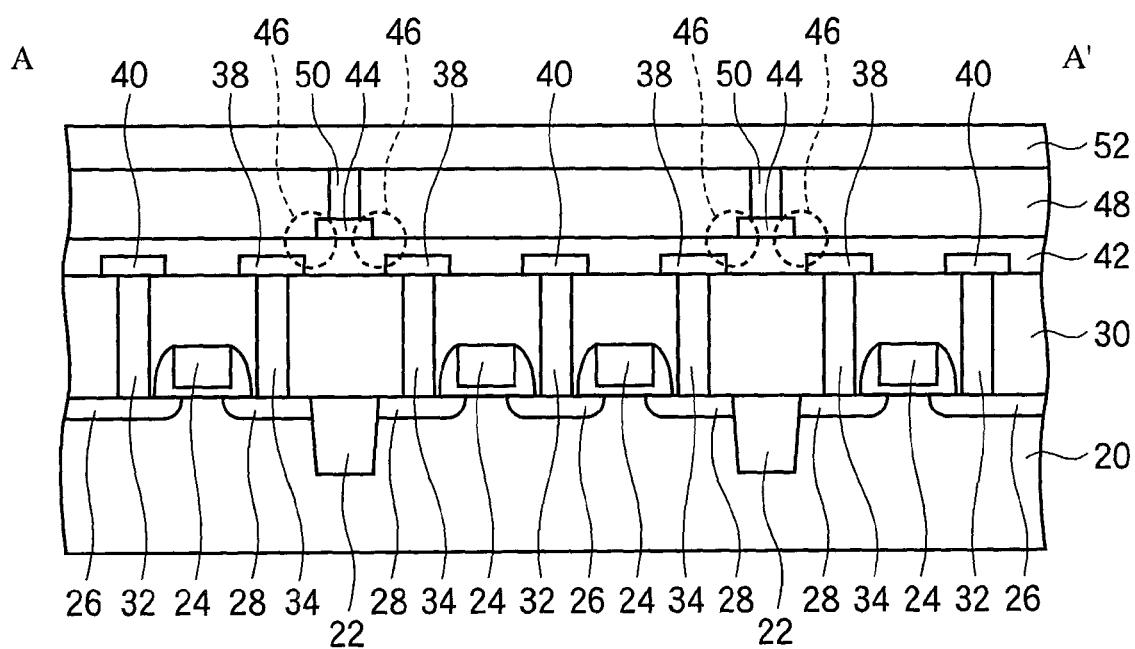
FIG. 15 is a diagrammatic sectional view showing the structure of the nonvolatile semiconductor memory device according to the second embodiment of the present invention.

As shown in FIGS. 14 and 15, a device isolation film 22 for defining device regions is formed in a silicon substrate 20. In the device regions of the silicon substrate 20, cell select transistors each including a gate electrode 24 and source/drain regions 26, 28 are formed.

As shown in FIG. 14, the gate electrodes 24 function as word lines WL commonly connecting the gate electrodes 24 of the cell select transistors adjacent to each other column-wise (vertically in the drawing).

Over the silicon substrate 10 with the cell select transistors formed on, an inter-layer insulating film 30 with contact plugs 32 electrically connected to the source/drain regions 26 and contact plugs 34 electrically connected to the source/drain regions 28 buried in is formed. Over the inter-layer insulating film 30, source lines 40 electrically connected to the source/drain regions 26 via the contact plugs 32 and electrodes 38 electrically connected to the source/drain regions 28 via the contact plugs 34 are formed. As shown in FIG. 14, the source lines 40 are extended column-wise. The electrodes 38 are formed one for one contact plug 34.

Over the inter-layer insulating film 30 with the electrodes 38 and the source lines 40 formed on, a resistance memory layer 42 of a resistance memory material is formed. The resistance memory material may be either of the bipolar resistance material and the unipolar resistance memory material. Over the resistance memory layer 42, electrodes 44 are formed. The electrodes 44 are formed, each positioned between two electrodes 38 which are row-wise (horizontally in the drawing) adjacent to each other with the device isolation region therebetween, and arranged, not overlapping the electrode 38 in the plane layout. Thus, over the inter-layer insulating film 30, resistance memory elements 46 each including the electrode 38, the resistance memory layer 42 and the electrode 44 are formed (the parts enclosed by the dotted lines in the drawing).

Over the resistance memory layer 42 with the electrodes 44 formed on, an inter-layer insulating film 48 is formed. In the inter-layer insulating film 48, contact plugs 50 are buried, electrically connected to the electrodes 44. Over the inter-layer insulating film 48 with the contact plugs 50 buried in, bit liens 52 are formed, electrically connected to the electrodes 44 via the contact plugs 50 and extended in the row direction which is perpendicular to the word lines WL.

As described above, the nonvolatile semiconductor memory device according to the present embodiment is characterized mainly in that the upper electrode (electrode 44) of the resistance memory element 46 is commonly included. The electric characteristics of the resistance memory element 46 are defined by the filament shaped property changed region formed in the resistance memory layer 42. When two lower electrodes (electrodes 38) are provided for one upper electrode (electrode 44), filament shaped property changed regions are formed respectively between the upper electrode and the two lower electrodes to be the memory regions and can function as two resistance memory elements 46.

The filament shaped property changed regions formed in the resistance memory layer 42 are very small, and the electrodes 38, 44 can be diminished to the minimum processing dimensions of the design rule. Thus, the device can be downsized.

It is necessary that the two electrodes 38 associated with one electrode 44 are laid out at an interval which does not cause the forming in the resistance memory layer 42 between the electrodes 38 upon a data rewriting of the resistance memory element 46. That is, the interval between the electrodes 38 is defined that a voltage causing the forming in the resistance memory layer 42 between the electrodes 38 becomes larger than a maximum voltage difference between the electrodes 38 upon a data rewriting of the resistance memory element 46.

When a maximum voltage difference to be applied between the electrodes 38 upon a data rewriting of the resistance memory element 46 is a writing voltage (set voltage) of the resistance memory element 46, the voltage causing the forming is about 1.7 V for the resistance memory element 46 exhibiting, e.g., the characteristics of FIG. 6. When the film thickness of the resistance memory layer 42 whose voltage causing the forming is 1.7 V is computed from the graph of FIG. 4, the film thickness is about 9 nm. That is, the interval between the electrodes 38 is made larger than 9 nm, whereby the forming never takes place in the resistance memory layer 42 between the electrodes 38 even when a voltage equivalent to the set voltage or the reset voltage is applied between the electrodes 38.

It is preferable to set the interval between the electrodes 38 suitably depending on a structure and constituent material of the resistance memory element 4r6, the method of applying the voltage upon a data rewrite, etc.

The electrode 38 and the electrode 44 can be arranged, overlapping each other in the plane layout, but in the nonvolatile semiconductor memory device according to the present embodiment, the electrode 38 and the electrode 44 are positively made not to overlap each other in the plane layout.

When the electrode 38 and the electrode 44 are arranged not to overlap each other in the plane layout, the property changed region (memory region) formed between the electrodes 38, 44 by the forming is formed, extended tilted to the film thickness direction (depth direction) of the resistance memory layer 42 as exemplified in FIGS. 9A to 9C. With the film thickness of the resistance memory layer 42 being uniform, the arrangement that the electrode 38 and the electrode 44 are arranged not overlap each other in the plane layout can make the length of the property changed region (distance between the electrodes 38, 44) longer than the arrangement that the both overlap each other in the plane layout. In other word, when the property changed region of a uniform length is formed, the arrangement that the electrode 38 and the electrode 44 do not overlap each other in the plane layout can make the film thickness of the resistance memory layer 42 smaller. Thus, the electrodes 38 and 44 are so arranged, whereby the manufacturing process can be simplified.

In the nonvolatile semiconductor memory device according to the present embodiment, the current path to be generated by the forming is formed in a direction tilted to the direction of the film thickness of the resistance memory layer 42 (see FIG. 9B).

The memory cell 10 of the nonvolatile semiconductor memory device according to the present embodiment shown in FIGS. 14 and 15 includes a resistance memory element 12 and a cell select transistor 14. The resistance memory element 12 has one end connected to a bit line BL and the other end connected to the drain terminal of the cell select transistor 14. The cell select transistor 14 has the source end connected to a source line SL and the gate terminal connected to a word line WL. Such memory cells 10 are formed adjacent to each other column-wise (vertically in the drawing) and row-wise (horizontally in the drawing).

A plurality of word lines WL1, /WL1, WL2, /WL2, . . . are arranged column-wise and form signal lines common among the memory cells 10 arranged column-wise. Source lines SL1, SL2, . . . are arranged also column-wise and form common signal lines among the memory cells 10 arranged column-wise. The source lines SL are provided one for two word lines WL.

A plurality of bit lines BL1, BL2, BL3, BL4, . . . are arranged row-wise (horizontally in the drawings) and form signal lines common among the memory cells 10 arranged row-wise.

Next, the writing method of the nonvolatile semiconductor memory device according to the present embodiment will be explained with reference to FIG. 16. It is assumed here that the forming process of the resistance memory element has been done.

First, the rewriting operation from the high resistance state to the low resistance state, i.e., the operation of the set will be explained. The memory cell 10 to be rewritten is the memory cell 10 connected to the word line WL1 and the bit line BL1.

First, a prescribed voltage is applied to the word line WL1 to turn on the cell select transistor 14. The source line SL1 is connected to a reference potential, e.g., 0 V, which is the ground potential.

Next, to the bit line BL1, a bias voltage which is the same as or a little larger than a voltage necessary to set the resistance memory element 12 is applied. For the resistance memory element having the characteristics shown, e.g., FIG. 6, a bias voltage of, e.g., about 2 V is applied.

Thus, a current path to the source line SL1 via the bit line BL1, the resistance memory element 12 and the cell select transistor 14 is formed, and the applied bias voltage is divided to the resistance memory element 12, the cell select transistor respectively corresponding to a resistance value $R_H$ of the resistance memory element 12 and a channel resistance $R_{CS}$ of the cell select transistor 14.

At this time, because of the resistance value $R_H$ Of the resistance memory element 12 which is sufficiently larger than the channel resistance $R_{CS}$ of the cell select transistor, most of the bias voltage is applied to the resistance memory element 12. Thus, the resistance memory element 12 is changed from the high resistance state to the low resistance state.

Then, after the bias voltage to be applied to the bit line BL1 has been returned to 0 V, the voltage to be applied o the word line WL1 is turned off, and the set operation is completed.

Figure 16:
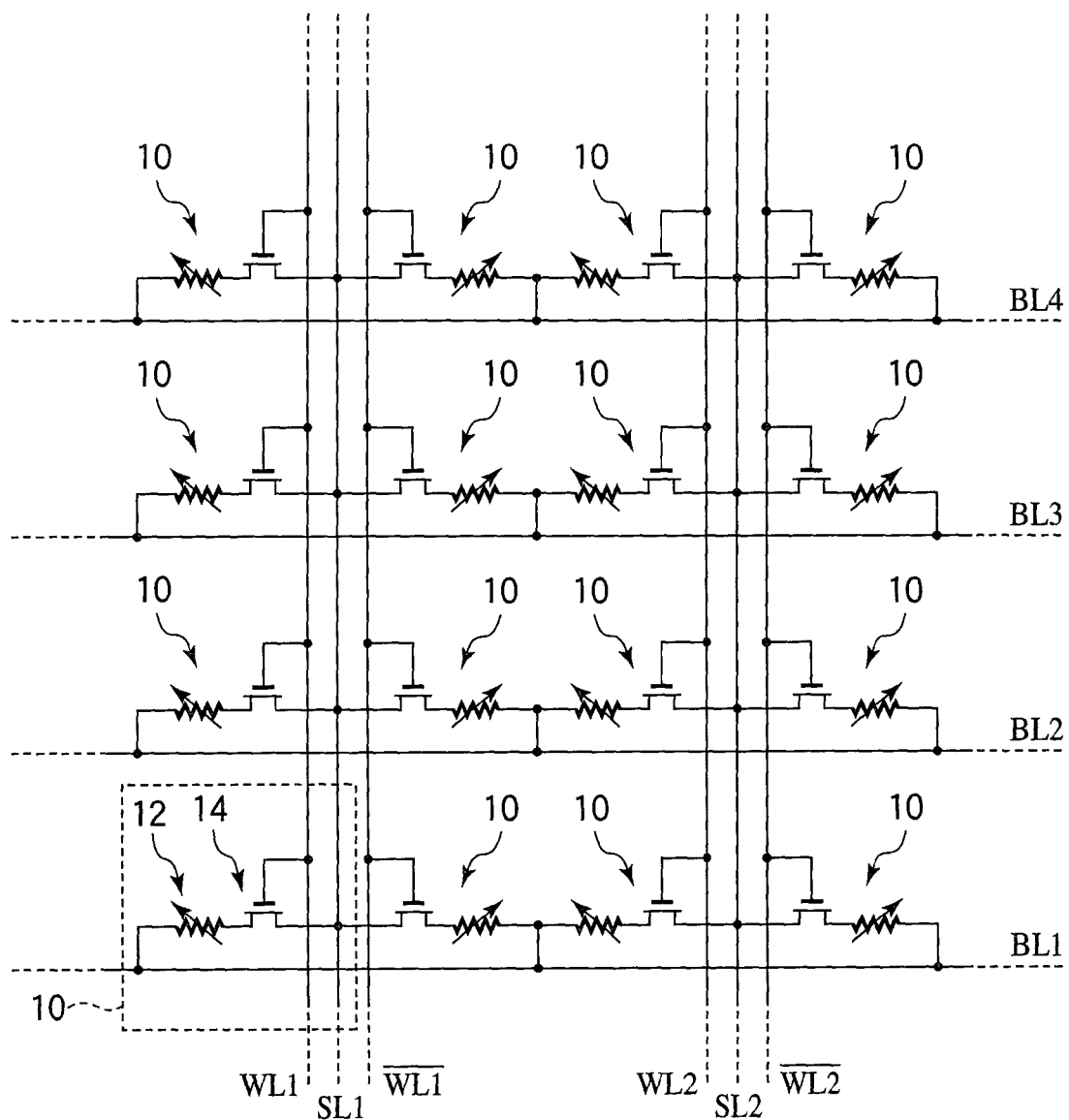
FIG. 16 is a circuit diagram showing the structure of the nonvolatile semiconductor memory device according to the second embodiment of the present invention.

In the nonvolatile semiconductor memory device according to the present embodiment, as shown in FIG. 16, the word lines WL and the source lines SL are arranged column-wise, and the memory cells to connected to one word line (e.g., the word line WL1) are connected to the same source line SL (e.g., SL1). Accordingly, in the set operation described above, a plurality of the bit lines (e.g., BL1-BL4) are concurrently driven, whereby a plurality of the memory cells to connected to the selected word lines (e.g., the word lien WL1) can be set at once.

Next, the rewriting operation from the low resistance state to the high resistance state, i.e., the operation of the reset will be explained. The memory cell 10 to be rewritten is a memory cell 10 connected to the word line WL1 and the bit line BL1.

First, a prescribed voltage is applied to the word line WL1 to turn on the cell select transistor 14. At this time, the applied voltage to the word line WL1 is controlled so that the channel resistance $R_{CS}$ of the cell select transistor 14 becomes sufficiently smaller than the resistance state $R_L$ of the resistance memory element 12 in the low resistance state. The source line SL is connected to a reference voltage, e.g., 0 V, which is the ground voltage.

Next, to the bit line BL1, a bias voltage which is the same as or a little larger than the voltage necessary to reset the resistance memory element 12 is applied. For the resistance memory element having the characteristics of, e.g., FIG. 6, a bias voltage of, e.g., about 1.2 V is applied.

Thus, a current path to the source line SL1 via the bit line BL1, the resistance memory element 12 and the cell select transistor 14 is formed, and the applied bias voltage is divided to the resistance memory element 12 and the cell select transistor 14 respectively corresponding to a resistance voltage $R_L$ of the resistance memory element 12 and a channel resistance $R_{CS}$ of the cell select transistor 14.

At this time, because of the channel resistance $R_{CS}$ of the cell select transistor 14 which is sufficiently smaller than the resistance value $R_L$ of the resistance memory element 12, most of the applied bias voltage is applied to the resistance memory element 12. Thus, the resistance memory element 12 is changed form the low resistance state to the high resistance state.

In the reset process, the instant the resistance memory element 12 is changed to the high resistance state, almost all the bias voltage is divided to the resistance memory element 12, and it is necessary to prevent the resistance memory element 12 from being again set by the bias voltage. To this end, the bias voltage to be applied to the bit lien $B_L$ must be smaller than the voltage necessary for the set.

That is, in the reset process, to make the channel resistance $R_{CS}$ of the cell select transistor 14 sufficiently smaller than the resistance value $R_L$ of the resistance memory element 12, the gate voltage of the cell select transistor is adjusted while the bias voltage to be applied to the bit line BL is set at the voltage necessary for the reset and less the voltage necessary for the set.

Next, after the bias voltage to be applied to the bit line BL1 is returned to zero, the voltage to be applied to the word line WL is turned off, and the reset operation is completed.

In the nonvolatile semiconductor memory device according to the present embodiment, as shown in FIG. 16, the word lines WL and the source lines SL are arranged column-wise, and the memory cells 10 connected to the same word line (e.g., WL1) are connected to the same source line SL (e.g., SL1). Accordingly, in the reset operation described above, a plurality of the bit lines BL (e.g., BL1-BL4) are concurrently driven, whereby a plurality of the memory cells 10 connected to the selected word line (e.g., WL1) can be reset at once.

Then, the reading method of the nonvolatile semiconductor memory device according to the present embodiment will be explained with reference to FIG. 16. The memory cell 10 to be read is a memory cell 10 connected to the word line WL1 and the bit line BL1.

First, a prescribed voltage is applied to the word line WL1 to turn on the cell select transistor 14. At this time, the voltage to be applied to the word line WL1 is controlled so that the channel resistance of the cell select transistor 14 becomes sufficiently smaller than the resistance value $R_L$ of the resistance memory element 12 in the low resistance state. The source line SL1 is connected to a reference potential, e.g., 0 V, which is the ground potential.

Next, this bias voltage is set so that the resistance memory element 12 is neither set nor reset by the voltage application even when the resistance memory element 12 in either resistance state. When the resistance memory element 12 has the current-voltage characteristics of, e.g., FIG. 2, neither the set nor the reset takes place when the bias voltage is below about 1.2 V. Accordingly, the bias voltage for the reading is set at a voltage which ensures a sufficient margin, e.g., a voltage of less than 1.2 V, e.g., at 0.5 V.

When such bias voltage is applied to the bit line BL1, current corresponding to the resistance value of the resistance memory element 12 flows in the bit line BL1. Accordingly, this current value flowing in the bit line BL1 is detected, whereby it can be read which resistance state the resistance memory element 12 has.

Next, the method of manufacturing the nonvolatile semiconductor memory device according to the present embodiment will be explained with reference to FIG. 17A to FIG. 17E.

Figure 17A:
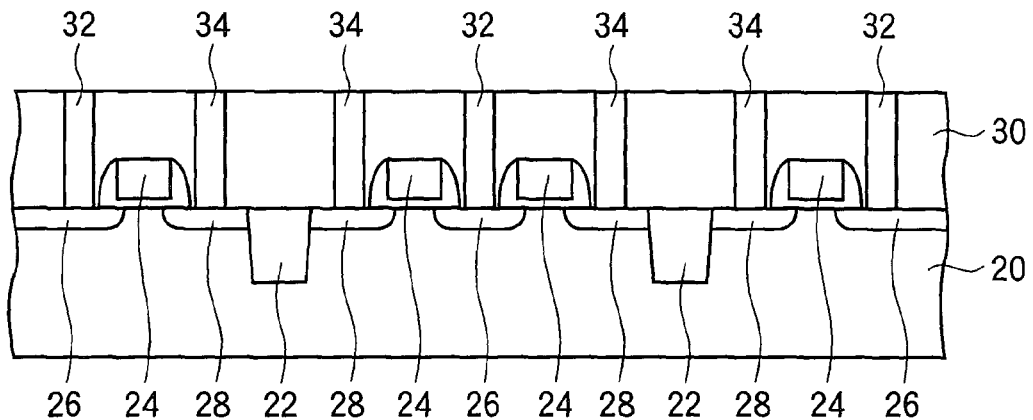
FIGS. 17A-17E are sectional views showing the method of manufacturing the nonvolatile semiconductor memory device according to the second embodiment of the present invention.

First, in the same way as in the method of manufacturing the nonvolatile semiconductor memory device according to the first embodiment shown in, e.g., FIGS. 13A to 13B, over the silicon substrate 20, a device isolation film 22, the cell select transistors each including the gate electrode 22 and the source/drain regions 26, 28, the inter-layer insulating film 30, and the contact plugs 32, 34 are formed (FIG. 17A).

Next, over the inter-layer insulating film 30 with the contact plugs 32, 34 buried in, a platinum (Pt) film is deposited by, e.g., CVD method.

Figure 17B:
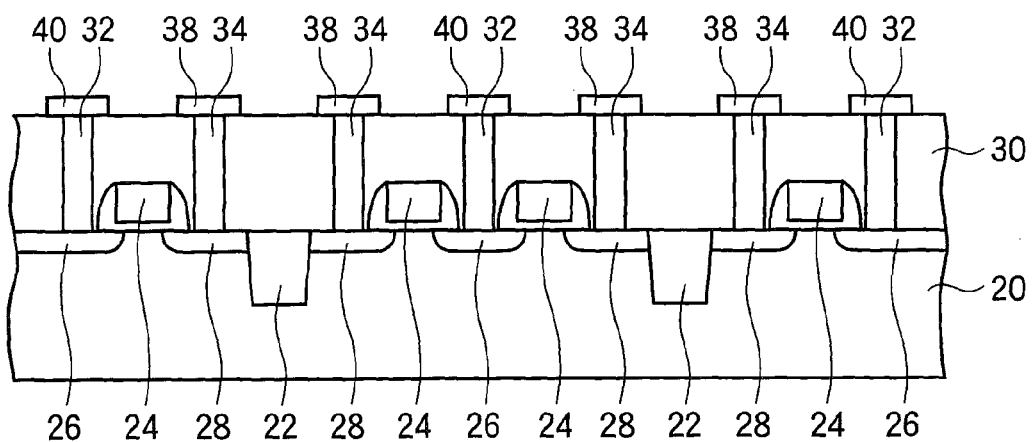

Next, by photolithography and dry etching, the platinum film is patterned to form the source lines 40 electrically connected to the source/drain regions 26 via the contact plugs 32, and the electrodes 38 electrically connected to the source/drain regions 28 via the contact plugs 34 (FIG. 17B).

Next, over the inter-layer insulating film 30 with the electrodes 38 and the source lines 40 formed on, a $TiO_x$ film is deposited by laser abrasion method, sol-gel method, sputtering method, MOCVD method or others to form the resistance memory layer 42 of the $TiO_x$ film.

Next, over the resistance memory layer 42, a platinum film is deposited by, e.g., CVD method.

Figure 17C:
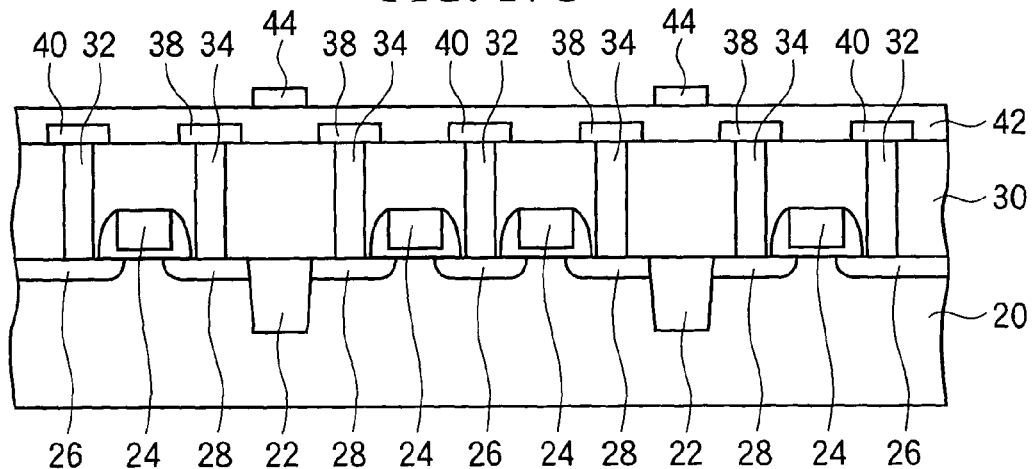

Next, by photolithography and dry etching, the platinum film is patterned to form the electrodes 44 of the platinum film (FIG. 17C).

Each electrode 44 is formed to be positioned between two electrodes 38 adjacent to each other in the extending direction of the bit line with the device isolation region positioned therebetween. Thus, two resistance memory elements 46 including the electrode 44 in common are formed adjacent to each other in the extending direction of the bit line with the device isolation region positioned therebetween.

Next, a silicon oxide film is deposited by, e.g., CVD method, and then the surface is planarized by, e.g., CMP method to form the inter-layer insulating film 48 of the silicon oxide film.

Next, by photolithography and dry etching, contact holes are formed in the inter-layer insulating film 48 down to the electrodes 44 of the resistance memory elements 46.

Figure 17D:
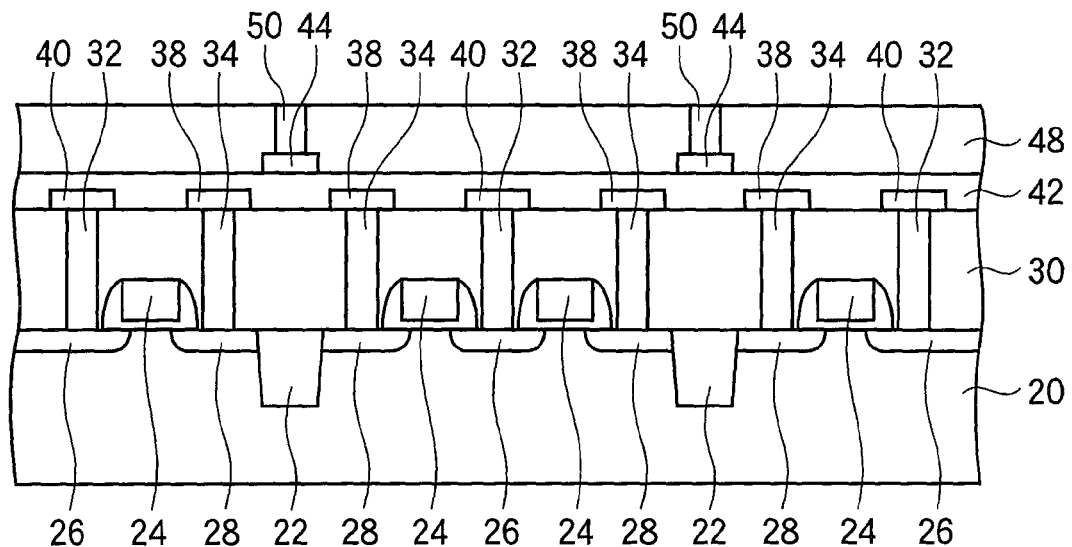

Next, a barrier metal and a tungsten film are deposited by, e.g., CVD method, and these conductive films are etched back to form the contact plugs 50 electrically connected to the electrodes 44 of the resistance memory elements 46 (FIG. 17D).

Figure 17E:
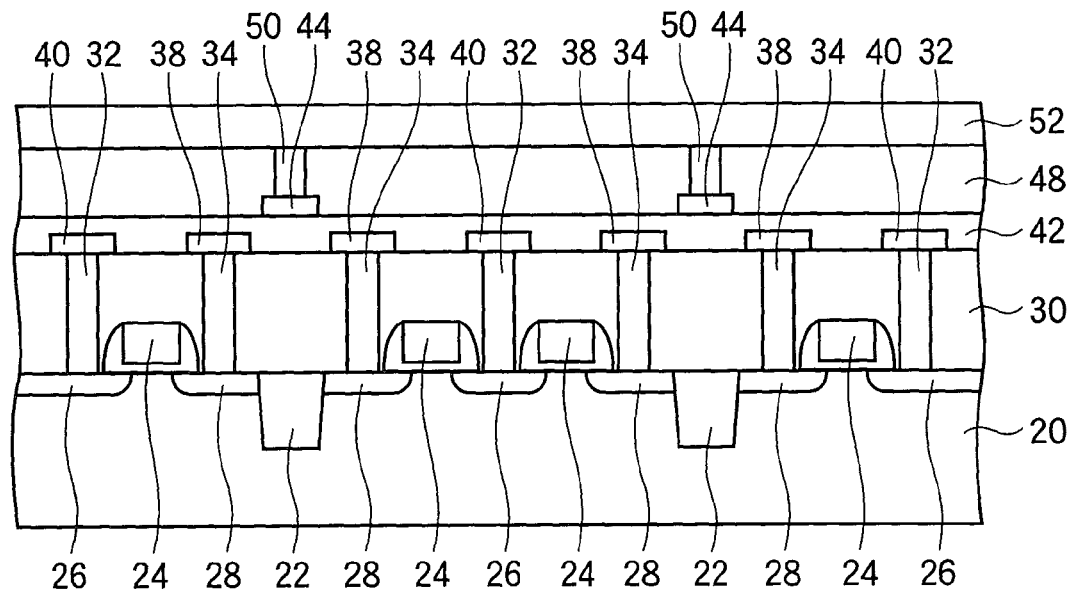

Then, over the inter-layer insulating film 48 with the contact plugs 50 buried in, a conductive film is deposited, and then the conductive film is patterned by photolithography and dry etching to form the bit lines 52 connected to the electrodes 44 of the resistance memory elements 46 via the contact plugs 50 (FIG. 17E).

Then, upper-level interconnection layers are formed as required, and the nonvolatile semiconductor memory device is completed.

As described above, according to the present embodiment, a pair of electrodes of each resistance memory element is arranged not to overlap each other in the plane layout, whereby the resistance memory layer can be thinner in comparison with in the arrangement that a pair of electrodes are arranged, overlapping each other in the plane layout. Thus, the process of manufacturing the resistance memory element can be simplified.

A Third Embodiment

The nonvolatile semiconductor memory device and method of manufacturing the same according to a third embodiment of the present invention will be explained with reference to FIGS. 18 to 20C. The members of the nonvolatile semiconductor memory device and the method of manufacturing the same according to the first and the second embodiments shown in FIGS. 10 to 13E are represented by the same reference numbers not to repeat or to simplify their explanation.

First, the structure of the nonvolatile semiconductor memory device according to the present embodiment will be explained with reference to FIGS. 18 and 19. FIG. 19 is the sectional view along the line A-A' in FIG. 18.

Figure 18:
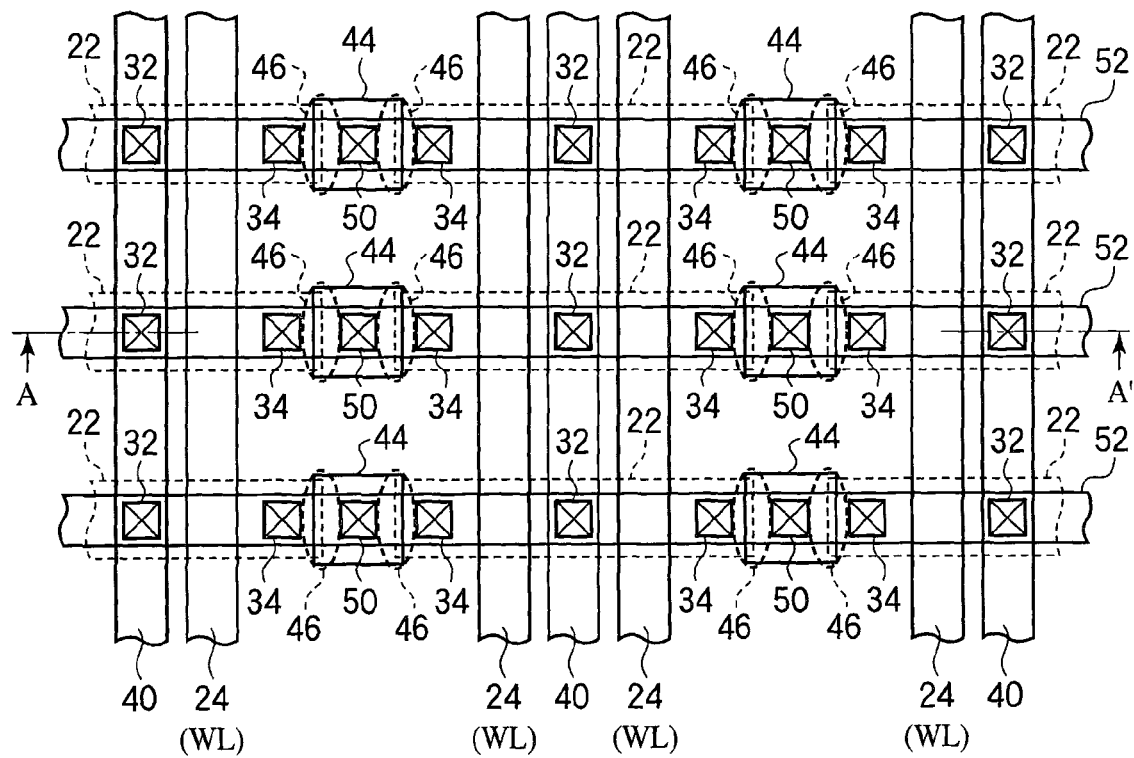
FIG. 18 is a plan view showing the structure of the nonvolatile semiconductor memory device according to a third embodiment of the present invention.
Figure 19:
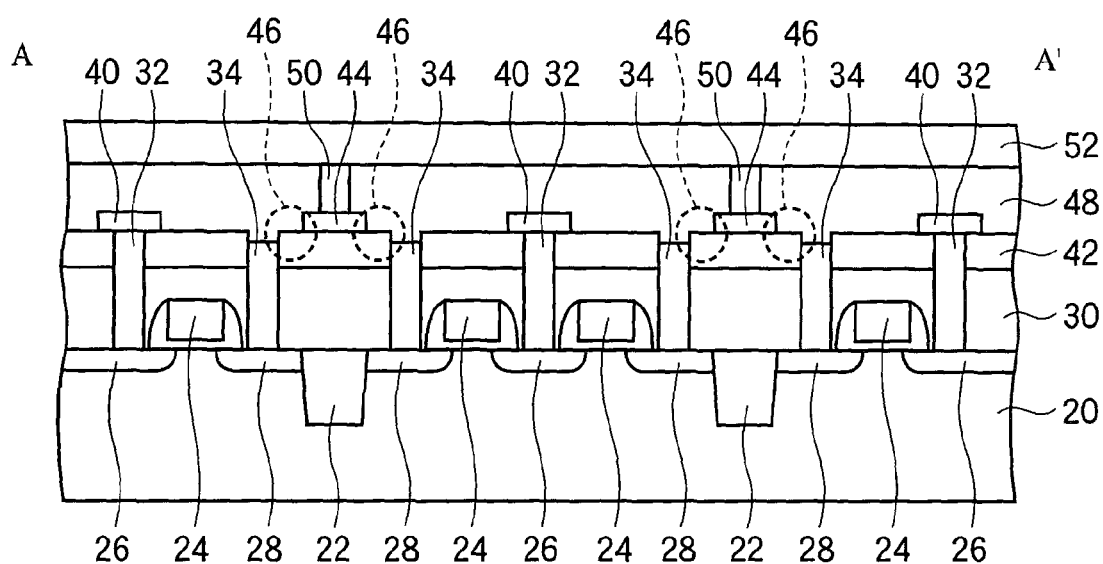
FIG. 19 is a diagrammatic sectional view showing the structure of the nonvolatile semiconductor memory device according to the third embodiment of the present invention.

As shown in FIGS. 18 and 19, in a silicon substrate 20, a device isolation film 22 for defining device regions is formed. In the device regions of the silicon substrate 20, cell select transistors each including a gate electrode 24 and source/drain regions 26, 18 are formed.

As shown in FIG. 18, the gate electrodes 24 function as word lines WL commonly connecting the gate electrodes 24 of the cell select transistors adjacent column-wise (vertically in the drawing).

Over the silicon substrate 20 with the cell select transistors formed on, an inter-layer insulating film 30 and a resistance memory layer 42 of a resistance memory material are formed. In the inter-layer insulating film 30 and the resistance memory layer 42, contact plugs 32 electrically connected to the source/drain regions 26 and contact plugs 34 electrically connected to the source/drain regions 28 are buried.

Over the resistance memory layer 42, source lines 40 electrically connected to the source/drain regions 26 via the contact plugs 32, and electrodes 44 each formed in a region between the contact plugs 34 adjacent to each other row-wise (horizontally in the drawing) with the device isolation film 22 positioned therebetween. As shown in FIG. 14, the source lines 40 are extended column-wise. The electrodes 44 are formed one for a pair of the contact plugs 34 adjacent row-wise with the device isolation film 22 positioned therebetween. Thus, over the inter-layer insulating film 30, resistance memory elements 46 each including the contact plug 34, the resistance memory layer 42 and the electrode 44 are formed (the parts enclosed by the dotted line in the drawing).

Over the resistance memory layer 42 with the source lines 40 and the electrodes 44 formed on, an inter-layer insulating film 48 is formed. In the inter-layer insulating film 48, contact plugs 50 electrically connected to the electrodes 44 are buried. Over the inter-layer insulating film 48 with the contact plugs 50 buried in, bit liens 52 are formed, electrically connected to the electrodes 44 via the contact plugs 50 and extended in the row direction (horizontally in the drawing) perpendicular to the word lines WL.

As described above, the nonvolatile semiconductor memory device according to the present embodiment is characterized, as is the nonvolatile semiconductor memory device according to the second embodiment, mainly in that the upper electrodes (electrodes 44) of the resistance memory elements 46 adjacent row-wise are common and the contact plugs 34 function as the lower electrodes. The electric characteristics of the resistance memory element 46 are defined by the filament shaped property changed region formed in the resistance memory layer 42. Accordingly, when two lower electrodes (contact plugs 34) are provided for one upper electrode (electrode 44), the filament shaped property changed regions are formed respectively between the upper electrode and the two lower electrodes as memory regions, and can function as two resistance memory elements 46.

The lower electrodes are provided by the contact plugs 34, whereby in comparison with the nonvolatile semiconductor memory device according to the second embodiment, larger margins can be provided for the layout of the upper electrodes (electrodes 44) and the manufacturing. This permits the manufacturing process to be simplified.

In the nonvolatile semiconductor memory device according to the present embodiment, the current path formed by the forming is formed in the resistance memory layer 42 between the contact plug 34 and the electrode 44 in a direction tilted to the layer thickness direction of the resistance memory layer 42 (see FIG. 9C).

It is necessary that the two lower electrodes (contact plugs 34) associated with one upper electrode (electrode 44) are arranged at an interval which does not cause the forming in the resistance memory layer 42. In the nonvolatile semiconductor memory device according to the present embodiment, however, because of the layout that the electrode 44 or the source line 40 is arranged between the contact plugs 34, the forming between the contact plugs 34 will cause not problem. Preferably, the interval between the contact plugs 34 is set suitably depending on the structure and constituent materials of the resistance memory element 46, the method of applying the voltage upon a data rewriting, etc.

The circuit diagram of the nonvolatile semiconductor memory device according to the present embodiment, and the writing method and the reading method thereof are the same as those of the second embodiment.

Then, the method of manufacturing the nonvolatile semiconductor memory device according to the present embodiment will be explained with reference to FIGS. 20A-20C.

First, in the same way as in the method of manufacturing the nonvolatile semiconductor memory device according to the first embodiment shown in, e.g., FIG. 13A, over the silicon substrate 20, the device isolation film 22 and the cell select transistors each including the gate electrode 24 and the source/drain regions 26, 28 are formed.

Next, over the silicon substrate 20 with the cell select transistors formed on, a silicon oxide film is deposited by, e.g., CVD method to form the inter-layer insulating film 30 of the silicon oxide film.

Next, over the inter-layer insulating film 30, a $TiO_x$ film is deposited by laser abrasion method, sol-gel method, sputtering method, MOCVD method or others to form the resistance memory layer 42 of the $TiO_x$ film.

Then, by photolithography and dry etching, contact holes are formed in the resistance memory layer 42 and the inter-layer insulating film 30 down to the source/drain regions 26, 28.

Figure 20A:
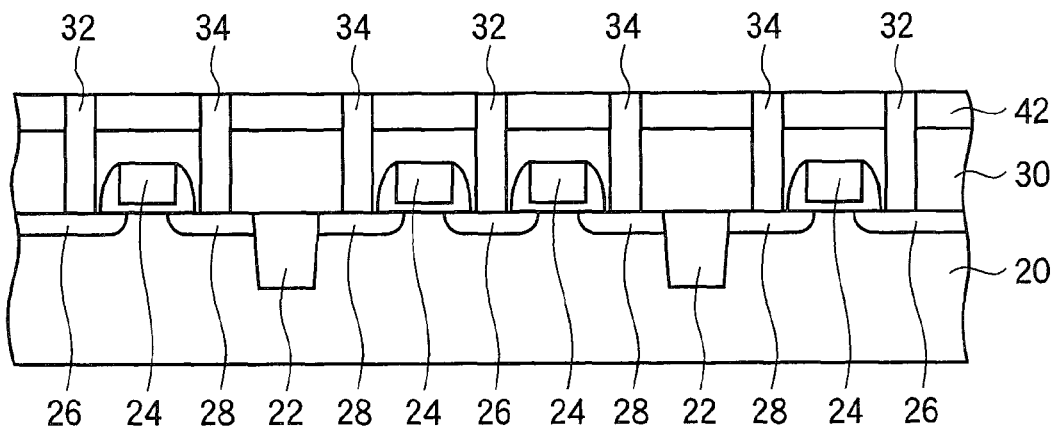
FIGS. 20A-20C are sectional views showing the method of manufacturing the nonvolatile semiconductor memory device according to the third embodiment of the present invention.

Next, by, e.g., CVD method, a barrier metal and a tungsten film are deposited, and then these conductive films are etched back to form in the contact holes the contact plugs 32 connected to the source/drain regions 26 and the contact plugs 34 connected to the source/drain regions 28 (FIG. 20A).

Next, over the inter-layer insulating film 30 with the contact plugs 32, 34 buried in, a platinum (Pt) film is deposited by, e.g., CVD method.

Next, the platinum film is patterned by photolithography and dry etching to form the source lines 40 electrically connected to the source/drain regions 26 via the contact plugs 32 and the electrodes 44 arranged between the contact plugs 34 adjacent to each other row-wise with the device isolation film 22 positioned therebetween. Thus, two resistance memory elements 46 including the electrode 44 in common are formed adjacent to each other in the extending direction of the bit line with the device isolation region positioned therebetween.

Figure 20B:
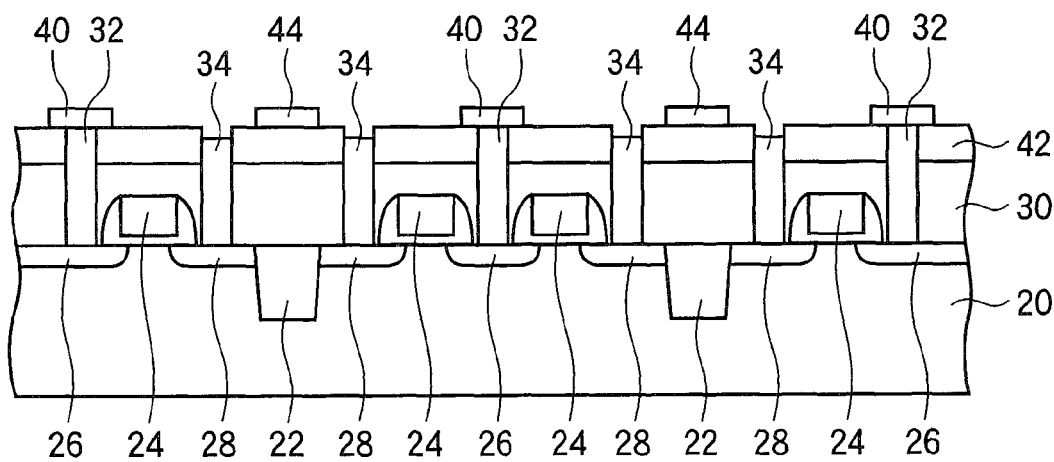

At this time, the upper surfaces of the contact plugs 34 are a little etched together with the platinum film, and the height of the upper surfaces of the contact plugs 34 become lower than the height of the surfaces of the resistance memory layer 42 (FIG. 20B).

The contact plugs 32, 34, the source lines 40 and the electrodes 44 can be simultaneously formed. The source lines 40 and the electrodes 44 can be formed simultaneously with burying the contact plugs 32, 34 in the contact holes by forming resist patterns, etc. in the regions where the source lines 40 and the electrodes 44 are to be formed. Thus, the manufacturing process can be simplified.

Then, a silicon oxide film is deposited by, e.g., CVD method, and the surface of the silicon oxide film is planarized by, e.g., CMP method to form the inter-layer insulating film 48 of the silicon oxide film.

Next, by photolithography and dry etching, in the inter-layer insulating film 48, contact holes are formed down to the electrodes 44 of the resistance memory elements 46.

Next, a barrier metal and a tungsten film are deposited by, e.g., CVD method, and these conductive films are etched back to form in the contact holes the contact plugs 50 electrically connected to the electrodes 44 of the resistance memory elements 46.

Figure 20C:
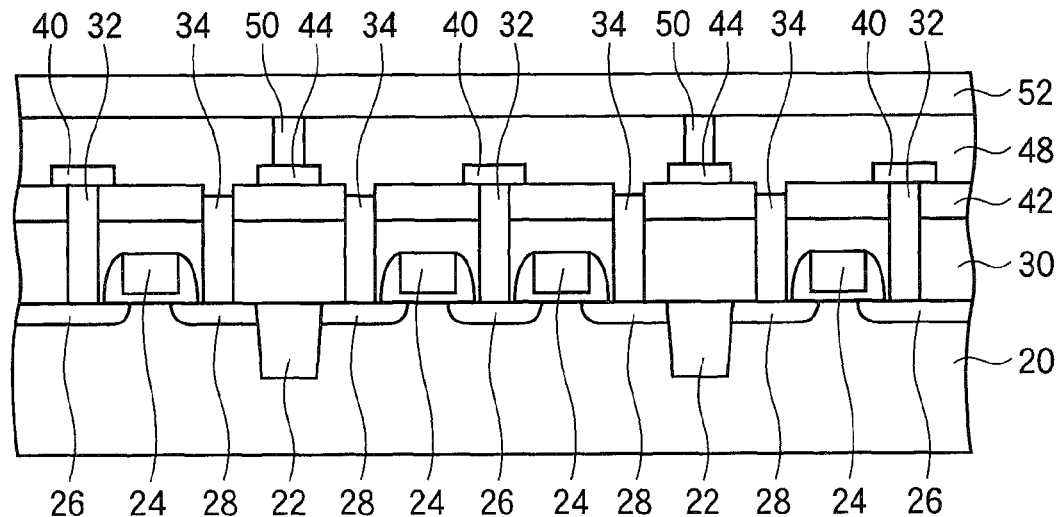

Next, over the inter-layer insulating film 48 with the contact plugs 50 buried in, a conductive film is deposited, and this conductive film is patterned by photolithography and dry etching to form the bit lines 52 connected to the electrodes 44 of the resistance memory elements 46 via the contact plugs 50 (FIG. 20C).

Then, upper-level interconnection layers are formed as required, and the nonvolatile semiconductor memory device is completed.

As described above, according to the present embodiment, one electrode of the resistance memory element is provided by the contact plug connected to the cell select transistor, whereby margins of the layout and of the manufacturing of the other electrode can be increased. Thus, the manufacturing process of the resistance memory elements can be simplified.

Modified Embodiments

The present invention is not limited to the above-described embodiments and can cover other various modifications.

For example, in the above-described embodiments, the resistance memory elements 42 include the resistance memory layer of $TiO_x$ film, but the resistance memory layer of the resistance memory elements is not limited to $TiO_x$. The resistance memory materials applicable to the invention of the present application are $TiO_x$, $NiO_x$, $YO_x$, $CeO_x$, $MgO_x$, $ZnO_x$, $HfO_x$, $WO_x$, $NbO_x$, $TaO_x$, $CrO_x$, $MnO_x$, $AlO_x$, $VO_x$, $SiO_x$, etc. Otherwise, oxide materials containing a plurality of metals and/or semiconductors, such as $Pr_{1-x}Ca_xMnO_3$, $La_{1-x}Ca_xMnO_3$, $SrTiO_3$, $YBa_2Cu_3O_y$, $LaNiO$, etc. can be used. These resistance memory materials can be used singly or in layer structures.

In the above-described embodiments, the upper electrodes and the lower electrodes are formed of platinum, but the material of the electrodes is not limited to platinum the electrode materials applicable to the invention of the present application are, e.g., Ir, W, Ni, Au, Cu, Ag, Pd, Zn, Cr, Al, Mn, Ta, Si, TaN, TiN, Ru, ITO, NiO, IrO, SrRuO, $CoSi_2$, $WSi_2$, $NiSi$, $MoSi_2$, $TiSi_2$, Al—Si, Al—Cu, Al—Si—Cu, etc.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A resistance memory element comprising:
   a first electrode formed over a first region of a substrate, the substrate having in a surface thereof the first region and a second region different from the first region;
   a second electrode formed over the second region of the substrate; and
   a resistance memory layer formed between the first electrode and the second electrode, wherein
   the resistance memory element memorizes a high resistance state or a low resistance state in a memory region and switched between the high resistance state and the low resistance state by an application of a voltage; and
   the first electrode, the second electrode and the resistance memory layer are formed on the same surface of the substrate.

2. A resistance memory element comprising:
   a first electrode formed over a first region of a substrate, the substrate having in a surface thereof the first region and a second region different from the first region;
   a second electrode formed over the second region of the substrate; and
   a resistance memory layer formed between the first electrode and the second electrode, wherein
   the resistance memory element memorizes a high resistance state or a low resistance state in a memory region and switched between the high resistance state and the low resistance state by an application of a voltage;
   the first electrode is formed on an underside of the resistance memory layer; and
   the second electrode is formed on an upper side of the resistance memory layer.

3. A resistance memory element comprising:
   a first electrode formed over a first region of a substrate, the substrate having in a surface thereof the first region and a second region different from the first region;
   a second electrode formed over the second region of the substrate; and
   a resistance memory layer formed between the first electrode and the second electrode, wherein
   the resistance memory element memorizes a high resistance state or a low resistance state in a memory region and switched between the high resistance state and the low resistance state by an application of a voltage;
   the first electrode is formed, buried in an opening formed in the resistance memory layer over the first region; and
   the second electrode is formed on the resistance memory layer.

4. The resistance memory element according to claim 1, wherein
   when the high resistance state and the low resistance state are switched from each other, a current path containing a memory region is formed in a direction tilted to an extending direction of the resistance memory layer or a direction of a thickness of the resistance memory layer in the resistance memory layer between the first electrode and the second electrode.

5. A semiconductor memory device comprising:
   a resistance memory element memorizing a high resistance state or a low resistance state in a memory region and switched between the high resistance state and the low resistance state by an application of a voltage, the resistance memory element including:
   a first electrode formed over a first region of a substrate, the substrate having in a surface thereof the first region and a second region different from the first region;
   a second electrode formed over the second region of the substrate; and
   a resistance memory layer formed between the first electrode and the second electrode, wherein
   the first electrode, the second electrode and the resistance memory layer are formed on the same surface of the substrate;
   a select transistor connected to the first electrode of the resistance memory element; and
   a signal line connected to the second electrode of the resistance memory element.

6. The semiconductor memory device according to claim 5, wherein
   the second electrode is formed integral with the signal line.

7. A semiconductor memory device comprising:
a resistance memory element memorizing a high resistance state or a low resistance state in a memory region and switched between the high resistance state and the low resistance state by an application of a voltage, the resistance memory element including:
   a first electrode formed over a first region of a substrate, the substrate having in a surface thereof the first region and a second region different from the first region;
   a second electrode formed over the second region of the substrate; and
   a resistance memory layer formed between the first electrode and the second electrode, wherein
   the first electrode is formed on an underside of the resistance memory layer, and
   the second electrode is formed on an upper side of the resistance memory layer;
a select transistor connected to the first electrode of the resistance memory element; and
a signal line connected to the second electrode of the resistance memory element.

8. A semiconductor memory device comprising:
a resistance memory element memorizing a high resistance state or a low resistance state in a memory region and switched between the high resistance state and the low resistance state by an application of a voltage, the resistance memory element including:
   a first electrode formed over a first region of a substrate, the substrate having in a surface thereof the first region and a second region different from the first region;
   a second electrode formed over the second region of the substrate; and
   a resistance memory layer formed between the first electrode and the second electrode, wherein
   the first electrode is formed, buried in an opening formed in the resistance memory layer over the first region, and
   the second electrode is formed on the resistance memory layer;
a select transistor connected to the first electrode of the resistance memory element; and
a signal line connected to the second electrode of the resistance memory element.

9. The semiconductor memory device according to claim 8, wherein
the first electrode is a contact plug connected to the select transistor.

10. The semiconductor memory device according to claim 5, wherein
when the high resistance state and the low resistance state are switched from each other, a current path containing a memory region is formed in a direction tilted to an extending direction of the resistance memory layer or a direction of a thickness of the resistance memory layer in the resistance memory layer between the first electrode and the second electrode.

11. A method of manufacturing a resistance memory element comprising:
forming a conductive film over a surface of a substrate, the substrate having in the surface a first region and a second region different from the first region;
patterning the conductive film to form a first electrode in the first region and a second electrode in the second region; and
forming a resistance memory layer over the substrate with the first electrode and the second electrode formed on, the resistance memory layer being formed at least over the surface of the substrate in a region between the first region and the second region, wherein
the resistance memory element memorizes a high resistance state or a low resistance state in a memory region and switched between the high resistance state and the low resistance state by applying a voltage between a pair of electrodes.

12. The method of manufacturing a resistance memory element according to claim 11, wherein
the resistance memory layer is formed of at least one material selected from the group consisting of $TiO_x$, $NiO_x$, $YO_x$, $CeO_x$, $MgO_x$, $ZnO_x$, $HfO_x$, $WO_x$, $NbO_x$, $TaO_x$, $CrO_x$, $MnO_x$, $AlO_x$, $VO_x$, $SiO_x$, $Pr_{1-x}Ca_xMnO_3$, $La_{1-x}Ca_xMnO_3$, $SrTiO_3$, $YBa_2Cu_3O_y$, and $LaNiO$.

13. The method of manufacturing a resistance memory element according to claim 11, wherein
a select transistor is formed under the resistance memory layer.

14. The method of manufacturing a resistance memory element according to claim 13, wherein
the select transistor is connected to the first electrode of the resistance memory element.

15. A method of manufacturing a resistance memory element comprising:
forming a first electrode over a first region of a substrate, the substrate having in a surface thereof the first region and a second region different from the first region;
forming a resistance memory layer at least over the first region and the second region of the substrate with the first electrode formed on; and
forming a second electrode on the resistance memory layer over the second region of the substrate with the resistance memory layer interposed between the first electrode and the second electrode, wherein
the resistance memory element memorizes a high resistance state or a low resistance state in a memory region and switched between the high resistance state and the low resistance state by applying a voltage between a pair of electrodes.

16. A method of manufacturing a resistance memory element comprising:
forming a resistance memory layer over a substrate, the substrate having in a surface thereof a first region and a second region different from the first region;
forming an opening in the first region of the resistance memory layer;
forming a first electrode in the opening; and
forming a second electrode on the resistance memory layer over the second region of the substrate with the resistance memory layer interposed between the first electrode and the second electrode, wherein
the resistance memory element memorizes a high resistance state or a low resistance state in a memory region and switched between the high resistance state and the low resistance state by applying a voltage between a pair of electrodes.

17. The method of manufacturing a resistance memory element according to claim 15, wherein
a select transistor connected to the first electrode of the resistance memory element is formed under the resistance memory layer.

* * * * *